United States Patent
Guilford et al.

(10) Patent No.: US 12,021,551 B2
(45) Date of Patent: Jun. 25, 2024

(54) METHOD AND APPARATUS FOR EFFICIENT DEFLATE DECOMPRESSION USING CONTENT-ADDRESSABLE DATA STRUCTURES

(71) Applicant: Intel Corporation, Santa Clara, CA (US)

(72) Inventors: James Guilford, Northborough, MA (US); Vinodh Gopal, Westborough, MA (US); Daniel Cutter, Maynard, MA (US); Kirk Yap, Westborough, MA (US)

(73) Assignee: Intel Corporation, Santa Clara, CA (US)

( * ) Notice: Subject to any disclaimer, the term of this patent is extended or adjusted under 35 U.S.C. 154(b) by 593 days.

(21) Appl. No.: 17/133,609

(22) Filed: Dec. 23, 2020

(65) Prior Publication Data
US 2022/0200623 A1 Jun. 23, 2022

(51) Int. Cl.
| | |
|---|---|
| *H03M 7/34* | (2006.01) |
| *G06F 3/06* | (2006.01) |
| *G11C 15/00* | (2006.01) |
| *H03M 7/30* | (2006.01) |
| *H03M 7/40* | (2006.01) |

(52) U.S. Cl.
CPC ............ *H03M 7/40* (2013.01); *G06F 3/0608* (2013.01); *G06F 3/0638* (2013.01); *G06F 3/0673* (2013.01); *G11C 15/00* (2013.01); *H03M 7/3086* (2013.01)

(58) Field of Classification Search
CPC ..... H03M 7/40; H03M 7/3086; G06F 3/0608; G06F 3/0638; G06F 3/0673; G11C 15/00
USPC .................................. 341/50, 51, 67, 65, 63
See application file for complete search history.

(56) References Cited

U.S. PATENT DOCUMENTS

| | | | |
|---|---|---|---|
| 10,083,034 B1 * | 9/2018 | Satpathy | ............. H03M 7/6005 |
| 2011/0283061 A1 * | 11/2011 | Reddy | .................... G11C 15/00 |
| | | | 711/108 |

* cited by examiner

*Primary Examiner* — Peguy Jean Pierre
(74) *Attorney, Agent, or Firm* — Nicholson De Vos Webster & Elliott LLP

(57) ABSTRACT

Apparatus and method for efficient compression block decoding using content-addressable structure for header processing. For example, one embodiment of an apparatus comprises: a header parser to extract a sequence of tokens and corresponding length values from a header of a compression block, the tokens and corresponding length values associated with a type of compression used to compress a payload of the compression block; and a content-addressable data structure builder to construct a content-addressable data structure based on the tokens and length values, the content-addressable data structure builder to write an entry in the content-addressable data structure comprising a length value and a count value, the count value indicating a number of times the length value was previously written to an entry in the content-addressable data structure.

36 Claims, 29 Drawing Sheets

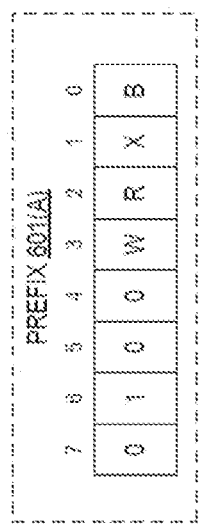
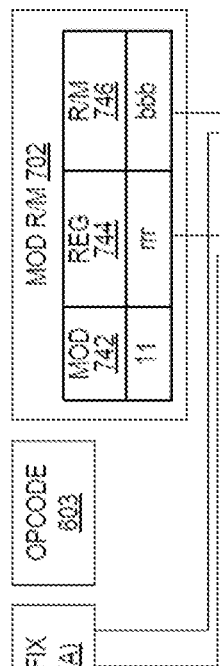
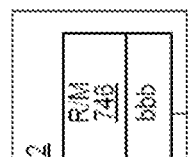
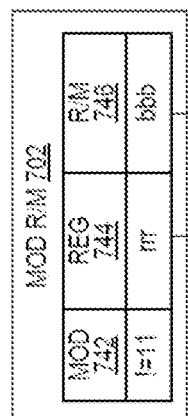
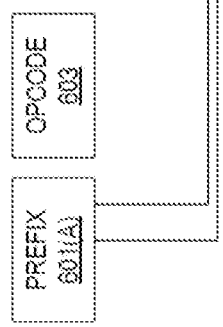
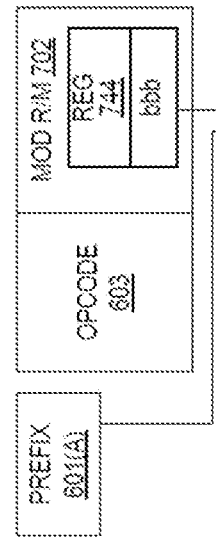
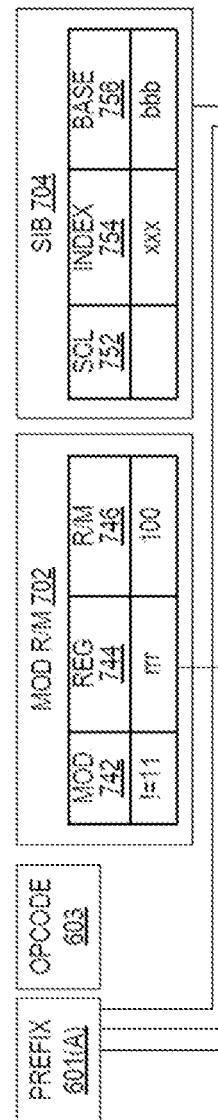
FIG. 8
FIG. 9(A)
FIG. 9(B)
FIG. 9(C)
FIG. 9(D)

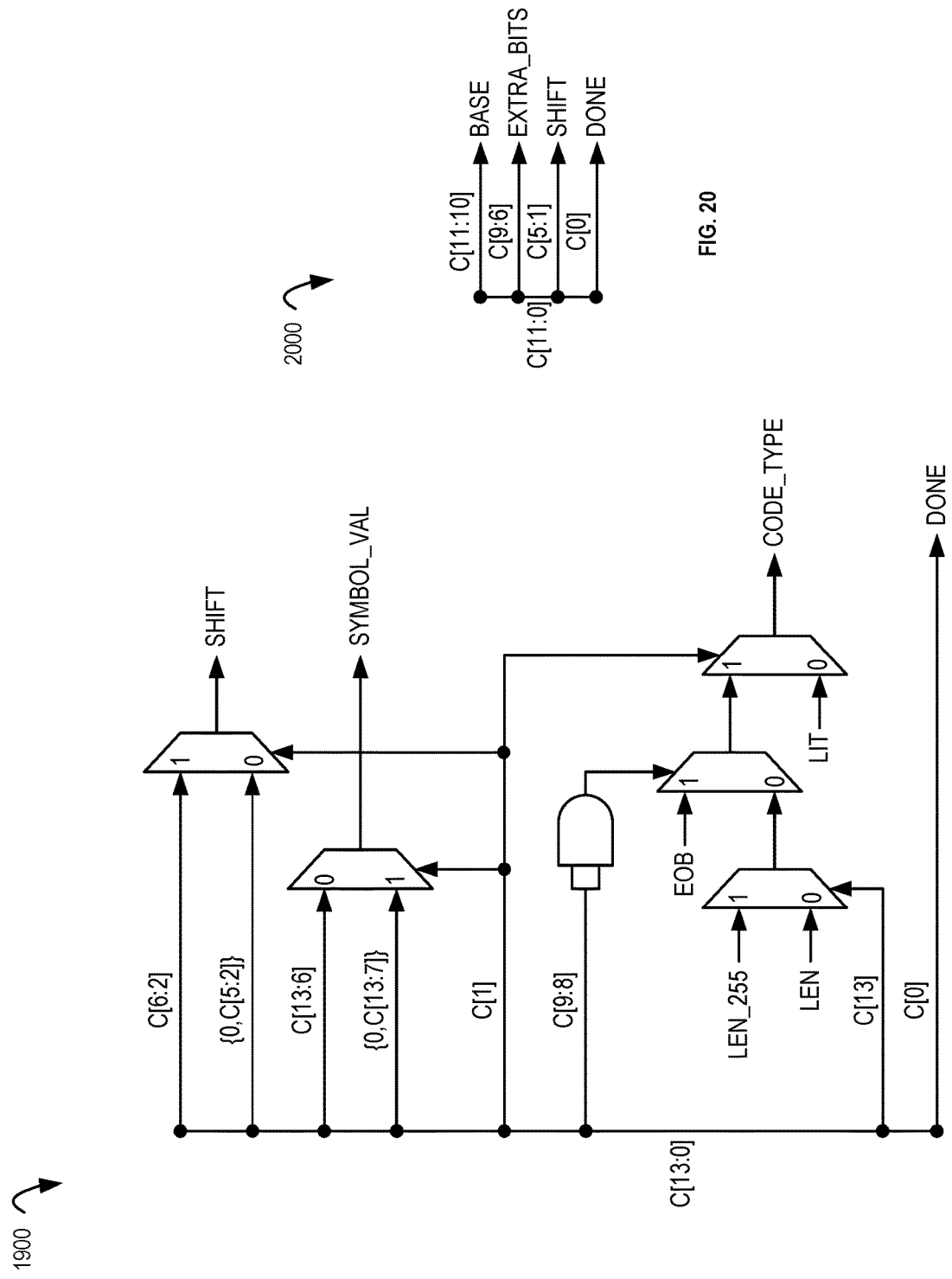

| Token | Code Length | Code Value | CAM Key |
|---|---|---|---|
| 0 | 3 | 100 | 3, 0 |
| 1 | 5 | 11110 | 5, 0 |
| 2 | 0 | - | 0, 0 |
| 3 | 4 | 1110 | 4, 0 |
| 4 | 3 | 101 | 3, 1 |
| 5 | 2 | 00 | 2, 0 |
| 6 | 0 | - | 0, 0 |
| 7 | 0 | - | 0, 0 |
| 8 | 5 | 11111 | 5, 1 |
| 9 | 2 | 01 | 2, 1 |
| 10 | 3 | 110 | 3, 2 |

METHOD AND APPARATUS FOR EFFICIENT DEFLATE DECOMPRESSION USING CONTENT-ADDRESSABLE DATA STRUCTURES

BACKGROUND

Field of the Invention

This invention relates generally to the field of computer processors. More particularly, the invention relates to a method and apparatus for efficient Deflate decompression using content-addressable data structures when performing header processing.

Description of the Related Art

An instruction set, or instruction set architecture (ISA), is the part of the computer architecture related to programming, including the native data types, instructions, register architecture, addressing modes, memory architecture, interrupt and exception handling, and external input and output (I/O). It should be noted that the term "instruction" generally refers herein to macro-instructions—that is instructions that are provided to the processor for execution—as opposed to micro-instructions or micro-ops—that is the result of a processor's decoder decoding macro-instructions. The micro-instructions or micro-ops can be configured to instruct an execution unit on the processor to perform operations to implement the logic associated with the macro-instruction.

The ISA is distinguished from the microarchitecture, which is the set of processor design techniques used to implement the instruction set. Processors with different microarchitectures can share a common instruction set. For example, Intel® Pentium 4 processors, Intel® Core™ processors, and processors from Advanced Micro Devices, Inc. of Sunnyvale CA implement nearly identical versions of the x86 instruction set (with some extensions that have been added with newer versions), but have different internal designs. For example, the same register architecture of the ISA may be implemented in different ways in different microarchitectures using well-known techniques, including dedicated physical registers, one or more dynamically allocated physical registers using a register renaming mechanism (e.g., the use of a Register Alias Table (RAT), a Reorder Buffer (ROB) and a retirement register file). Unless otherwise specified, the phrases register architecture, register file, and register are used herein to refer to that which is visible to the software/programmer and the manner in which instructions specify registers. Where a distinction is required, the adjective "logical," "architectural," or "software visible" will be used to indicate registers/files in the register architecture, while different adjectives will be used to designate registers in a given microarchitecture (e.g., physical register, reorder buffer, retirement register, register pool).

BRIEF DESCRIPTION OF THE DRAWINGS

A better understanding of the present invention can be obtained from the following detailed description in conjunction with the following drawings, in which:

FIG. 8 illustrates one embodiment of an instruction prefix;

FIGS. 9A-D illustrate embodiments of how the R, X, and B fields of the prefix are used;

FIG. 19 illustrates a circuit to determine from a table a literal symbol for a literal code and a length symbol for a length code according to embodiments of the disclosure;

FIG. 20 illustrates a circuit to determine from a table a distance symbol for a distance code according to embodiments of the disclosure.

FIG. 28A illustrates a sequential listing of tokens and associated code lengths, code values, and content addressable memory keys;

FIG. 29 illustrates one embodiment for storing tokens within a data structure;

DETAILED DESCRIPTION

In the following description, for the purposes of explanation, numerous specific details are set forth in order to provide a thorough understanding of the embodiments of the invention described below. It will be apparent, however, to one skilled in the art that the embodiments of the invention may be practiced without some of these specific details. In other instances, well-known structures and devices are shown in block diagram form to avoid obscuring the underlying principles of the embodiments of the invention.

Exemplary Computer Architectures

Detailed below are describes of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 1:
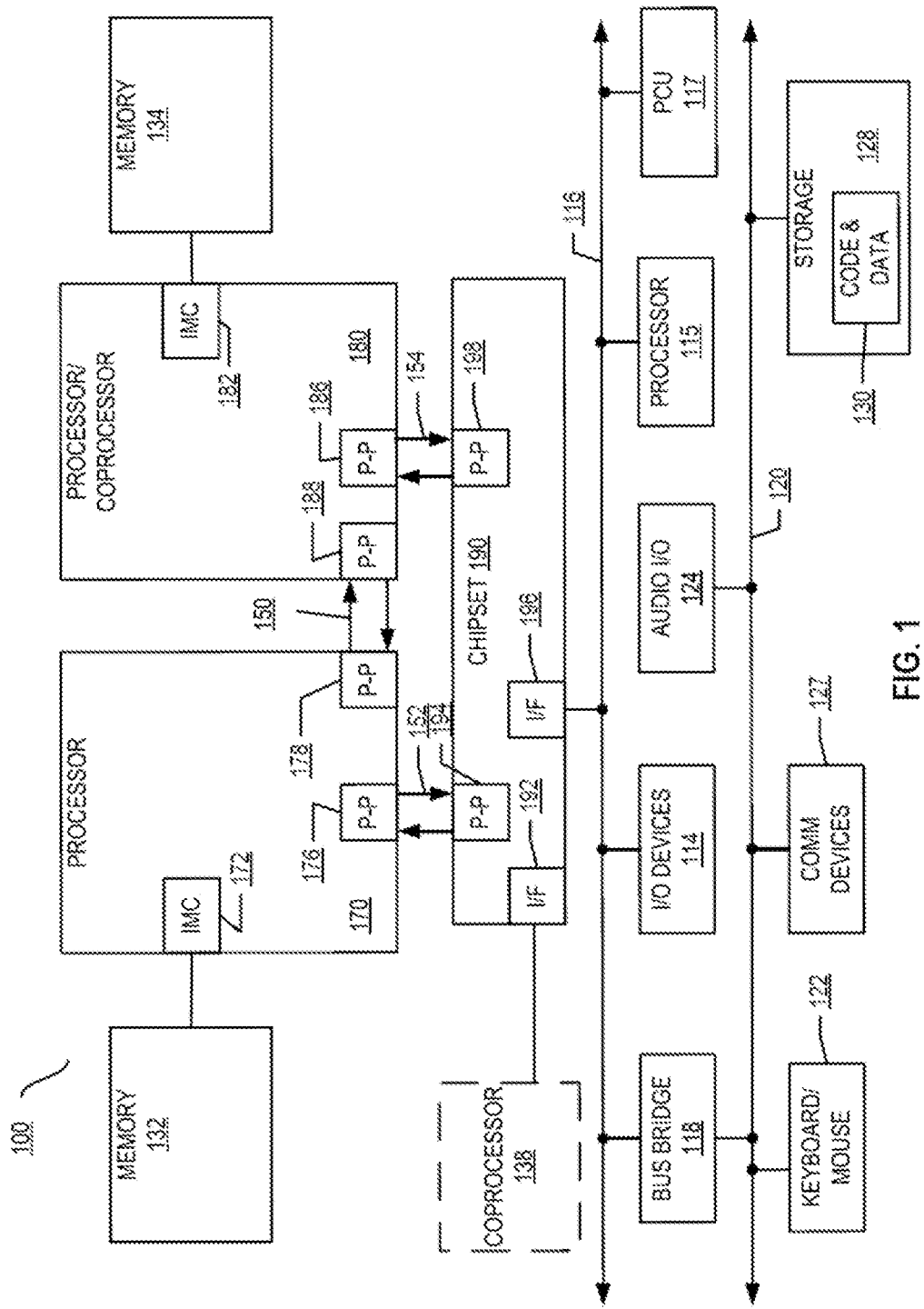
FIG. 1 illustrates an example computer system architecture.

FIG. 1 illustrates embodiments of an exemplary system.

Multiprocessor system 100 is a point-to-point interconnect system and includes a plurality of processors including a first processor 170 and a second processor 180 coupled via a point-to-point interconnect 150. In some embodiments, the first processor 170 and the second processor 180 are homogeneous. In some embodiments, first processor 170 and the second processor 180 are heterogenous.

Processors 170 and 180 are shown including integrated memory controller (IMC) units circuitry 172 and 182, respectively. Processor 170 also includes as part of its interconnect controller units point-to-point (P-P) interfaces 176 and 178; similarly, second processor 180 includes P-P interfaces 186 and 188. Processors 170, 180 may exchange information via the point-to-point (P-P) interconnect 150 using P-P interface circuits 178, 188. IMCs 172 and 182 couple the processors 170, 180 to respective memories, namely a memory 132 and a memory 134, which may be portions of main memory locally attached to the respective processors.

Processors 170, 180 may each exchange information with a chipset 190 via individual P-P interconnects 152, 154 using point to point interface circuits 176, 194, 186, 198. Chipset 190 may optionally exchange information with a coprocessor 138 via a high-performance interface 192. In some embodiments, the coprocessor 138 is a special-purpose processor, such as, for example, a high-throughput MIC processor, a network or communication processor, compression engine, graphics processor, GPGPU, embedded processor, or the like.

A shared cache (not shown) may be included in either processor 170, 180 or outside of both processors, yet connected with the processors via P-P interconnect, such that either or both processors' local cache information may be stored in the shared cache if a processor is placed into a low power mode.

Chipset 190 may be coupled to a first interconnect 116 via an interface 196. In some embodiments, first interconnect 116 may be a Peripheral Component Interconnect (PCI) interconnect, or an interconnect such as a PCI Express interconnect or another I/O interconnect. In some embodiments, one of the interconnects couples to a power control unit (PCU) 117, which may include circuitry, software, and/or firmware to perform power management operations with regard to the processors 170, 180 and/or co-processor 138. PCU 117 provides control information to a voltage regulator to cause the voltage regulator to generate the appropriate regulated voltage. PCU 117 also provides control information to control the operating voltage generated. In various embodiments, PCU 117 may include a variety of power management logic units (circuitry) to perform hardware-based power management. Such power management may be wholly processor controlled (e.g., by various processor hardware, and which may be triggered by workload and/or power, thermal or other processor constraints) and/or the power management may be performed responsive to external sources (such as a platform or power management source or system software).

PCU 117 is illustrated as being present as logic separate from the processor 170 and/or processor 180. In other cases, PCU 117 may execute on a given one or more of cores (not shown) of processor 170 or 180. In some cases, PCU 117 may be implemented as a microcontroller (dedicated or general-purpose) or other control logic configured to execute its own dedicated power management code, sometimes referred to as P-code. In yet other embodiments, power management operations to be performed by PCU 117 may be implemented externally to a processor, such as by way of a separate power management integrated circuit (PMIC) or another component external to the processor. In yet other embodiments, power management operations to be performed by PCU 117 may be implemented within BIOS or other system software.

Various I/O devices 114 may be coupled to first interconnect 116, along with an interconnect (bus) bridge 118 which couples first interconnect 116 to a second interconnect 120. In some embodiments, one or more additional processor(s) 115, such as coprocessors, high-throughput MIC processors, GPGPU's, accelerators (such as, e.g., graphics accelerators or digital signal processing (DSP) units), field programmable gate arrays (FPGAs), or any other processor, are coupled to first interconnect 116. In some embodiments, second interconnect 120 may be a low pin count (LPC) interconnect. Various devices may be coupled to second interconnect 120 including, for example, a keyboard and/or mouse 122, communication devices 127 and a storage unit circuitry 128. Storage unit circuitry 128 may be a disk drive or other mass storage device which may include instructions/code and data 130, in some embodiments. Further, an audio I/O 124 may be coupled to second interconnect 120. Note that other architectures than the point-to-point architecture described above are possible. For example, instead of the point-to-point architecture, a system such as multiprocessor system 100 may implement a multi-drop interconnect or other such architecture.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die as the described CPU (sometimes referred to as the application core(s) or application processor(s)), the above described coprocessor, and additional functionality. Exemplary core architectures are described next, followed by descriptions of exemplary processors and computer architectures.

Figure 2:
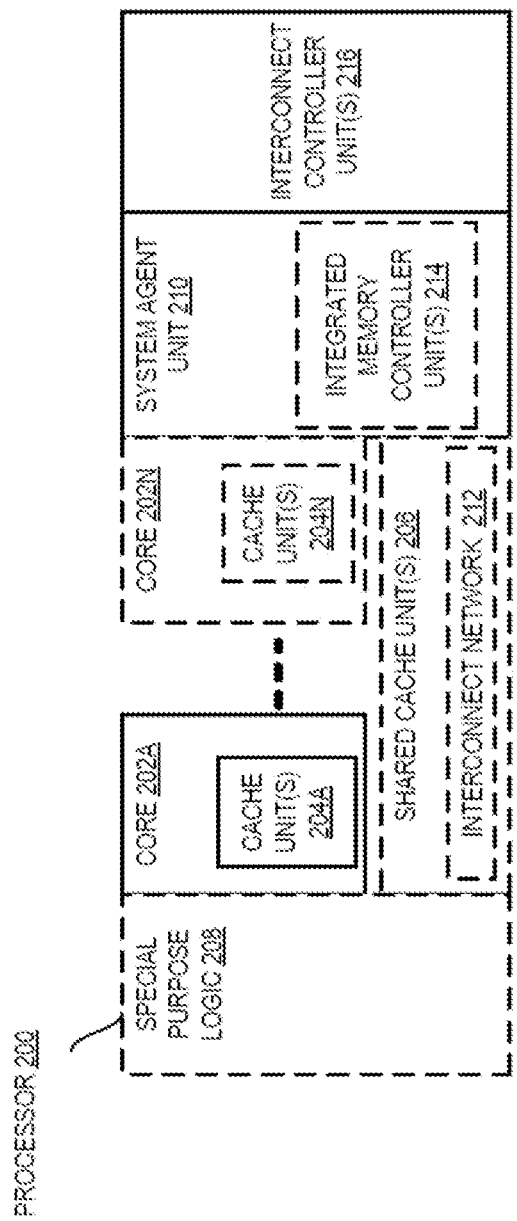
FIG. 2 illustrates a processor comprising a plurality of cores.

FIG. 2 illustrates a block diagram of embodiments of a processor 200 that may have more than one core, may have an integrated memory controller, and may have integrated graphics. The solid lined boxes illustrate a processor 200 with a single core 202A, a system agent 210, a set of one or more interconnect controller units circuitry 216, while the optional addition of the dashed lined boxes illustrates an alternative processor 200 with multiple cores 202(A)-(N), a set of one or more integrated memory controller unit(s) circuitry 214 in the system agent unit circuitry 210, and special purpose logic 208, as well as a set of one or more interconnect controller units circuitry 216. Note that the processor 200 may be one of the processors 170 or 180, or co-processor 138 or 115 of FIG. 1.

Thus, different implementations of the processor 200 may include: 1) a CPU with the special purpose logic 208 being integrated graphics and/or scientific (throughput) logic (which may include one or more cores, not shown), and the cores 202(A)-(N) being one or more general purpose cores (e.g., general purpose in-order cores, general purpose out-of-order cores, or a combination of the two); 2) a coprocessor with the cores 202(A)-(N) being a large number of special purpose cores intended primarily for graphics and/or scientific (throughput); and 3) a coprocessor with the cores 202(A)-(N) being a large number of general purpose in-order cores. Thus, the processor 200 may be a general-purpose processor, coprocessor or special-purpose processor, such as, for example, a network or communication processor, compression engine, graphics processor, GPGPU (general purpose graphics processing unit circuitry), a high-throughput many integrated core (MIC) coprocessor (including 30 or more cores), embedded processor, or the like. The processor may be implemented on one or more chips. The processor 200 may be a part of and/or may be implemented on one or more substrates using any of a number of process technologies, such as, for example, BiCMOS, CMOS, or NMOS.

A memory hierarchy includes one or more levels of cache unit(s) circuitry 204(A)-(N) within the cores 202(A)-(N), a set of one or more shared cache units circuitry 206, and external memory (not shown) coupled to the set of integrated memory controller units circuitry 214. The set of one or more shared cache units circuitry 206 may include one or more mid-level caches, such as level 2 (L2), level 3 (L3), level 4 (L4), or other levels of cache, such as a last level cache (LLC), and/or combinations thereof. While in some embodiments ring-based interconnect network circuitry 212 interconnects the special purpose logic 208 (e.g., integrated graphics logic), the set of shared cache units circuitry 206, and the system agent unit circuitry 210, alternative embodiments use any number of well-known techniques for interconnecting such units. In some embodiments, coherency is maintained between one or more of the shared cache units circuitry 206 and cores 202(A)-(N).

In some embodiments, one or more of the cores 202(A)-(N) are capable of multi-threading. The system agent unit circuitry 210 includes those components coordinating and operating cores 202(A)-(N). The system agent unit circuitry 210 may include, for example, power control unit (PCU) circuitry and/or display unit circuitry (not shown). The PCU may be or may include logic and components needed for regulating the power state of the cores 202(A)-(N) and/or the special purpose logic 208 (e.g., integrated graphics logic). The display unit circuitry is for driving one or more externally connected displays.

The cores 202(A)-(N) may be homogenous or heterogeneous in terms of architecture instruction set; that is, two or more of the cores 202(A)-(N) may be capable of executing the same instruction set, while other cores may be capable of executing only a subset of that instruction set or a different instruction set.

Exemplary Core Architectures

In-Order and Out-of-Order Core Block Diagram

Figure 3A:
FIG. 3A illustrates a plurality of stages of a processing pipeline.
Figure 3B:
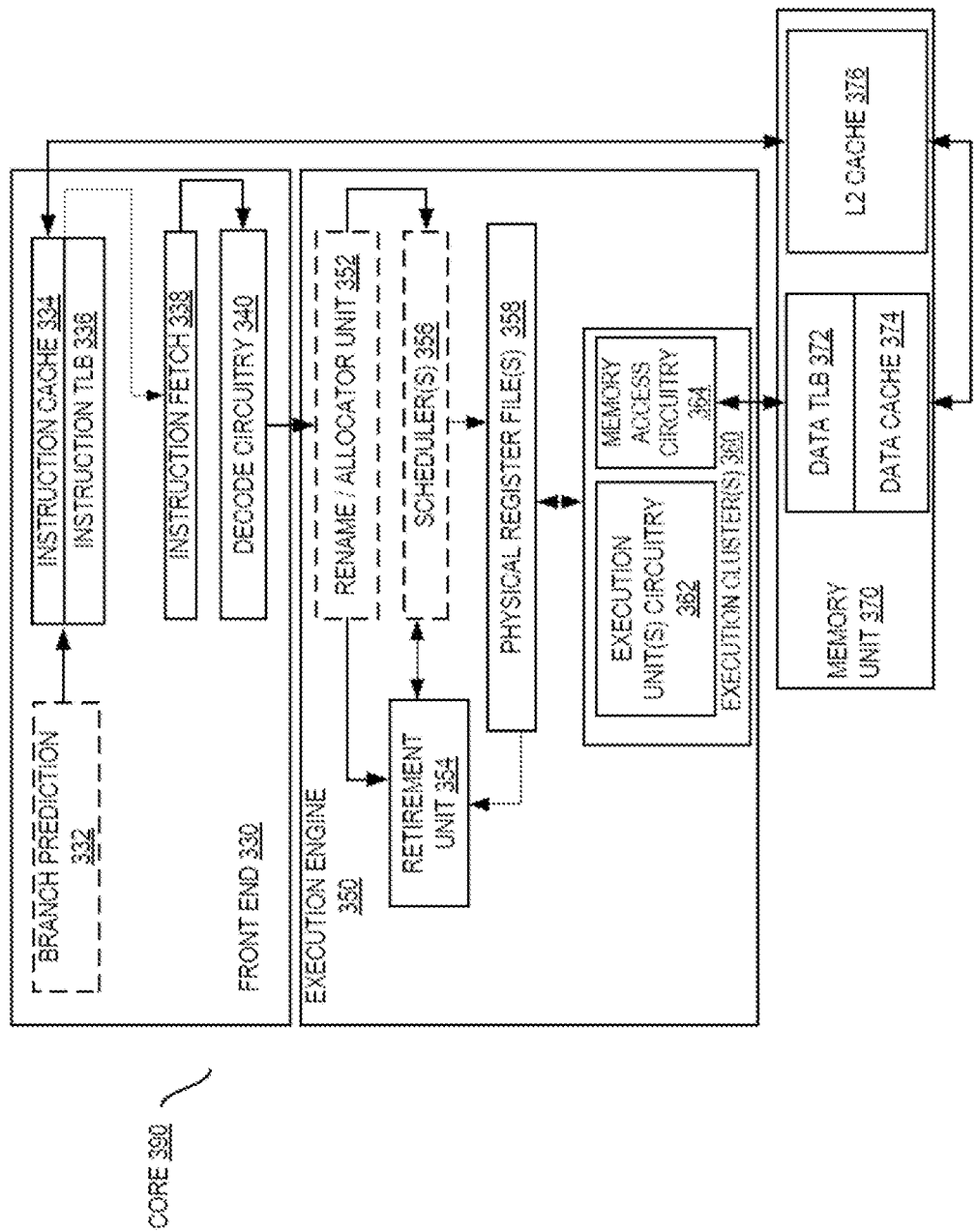
FIG. 3B illustrates details of one embodiment of a core.

FIG. 3(A) is a block diagram illustrating both an exemplary in-order pipeline and an exemplary register renaming, out-of-order issue/execution pipeline according to embodiments of the invention. FIG. 3(B) is a block diagram illustrating both an exemplary embodiment of an in-order architecture core and an exemplary register renaming, out-of-order issue/execution architecture core to be included in a processor according to embodiments of the invention. The solid lined boxes in FIGS. 3(A)-(B) illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 3(A), a processor pipeline 300 includes a fetch stage 302, an optional length decode stage 304, a decode stage 306, an optional allocation stage 308, an optional renaming stage 310, a scheduling (also known as a dispatch or issue) stage 312, an optional register read/memory read stage 314, an execute stage 316, a write back/memory write stage 318, an optional exception handling stage 322, and an optional commit stage 324. One or more operations can be performed in each of these processor pipeline stages. For example, during the fetch stage 302, one or more instructions are fetched from instruction memory, during the decode stage 306, the one or more fetched instructions may be decoded, addresses (e.g., load store unit (LSU) addresses) using forwarded register ports may be generated, and branch forwarding (e.g., immediate offset or an link register (LR)) may be performed. In one embodiment, the decode stage 306 and the register read/memory read stage 314 may be combined into one pipeline stage. In one embodiment, during the execute stage 316, the decoded instructions may be executed, LSU address/data pipelining to an Advanced Microcontroller Bus (AHB) interface may be performed, multiply and add operations may be performed, arithmetic operations with branch results may be performed, etc.

By way of example, the exemplary register renaming, out-of-order issue/execution core architecture may implement the pipeline 300 as follows: 1) the instruction fetch 338 performs the fetch and length decoding stages 302 and 304; 2) the decode unit circuitry 340 performs the decode stage 306; 3) the rename/allocator unit circuitry 352 performs the allocation stage 308 and renaming stage 310; 4) the scheduler unit(s) circuitry 356 performs the schedule stage 312; 5) the physical register file(s) unit(s) circuitry 358 and the memory unit circuitry 370 perform the register read/memory read stage 314; the execution cluster 360 perform the execute stage 316; 6) the memory unit circuitry 370 and the physical register file(s) unit(s) circuitry 358 perform the write back/memory write stage 318; 7) various units (unit circuitry) may be involved in the exception handling stage 322; and 8) the retirement unit circuitry 354 and the physical register file(s) unit(s) circuitry 358 perform the commit stage 324.

FIG. 3(B) shows processor core 390 including front-end unit circuitry 330 coupled to an execution engine unit circuitry 350, and both are coupled to a memory unit circuitry 370. The core 390 may be a reduced instruction set computing (RISC) core, a complex instruction set computing (CISC) core, a very long instruction word (VLIW) core, or a hybrid or alternative core type. As yet another option, the core 390 may be a special-purpose core, such as, for example, a network or communication core, compression engine, coprocessor core, general purpose computing graphics processing unit (GPGPU) core, graphics core, or the like.

The front end unit circuitry 330 may include branch prediction unit circuitry 332 coupled to an instruction cache unit circuitry 334, which is coupled to an instruction translation lookaside buffer (TLB) 336, which is coupled to instruction fetch unit circuitry 338, which is coupled to decode unit circuitry 340. In one embodiment, the instruction cache unit circuitry 334 is included in the memory unit circuitry 370 rather than the front-end unit circuitry 330. The decode unit circuitry 340 (or decoder) may decode instructions, and generate as an output one or more micro-operations, micro-code entry points, microinstructions, other instructions, or other control signals, which are decoded from, or which otherwise reflect, or are derived from, the original instructions. The decode unit circuitry 340 may further include an address generation unit circuitry (AGU, not shown). In one embodiment, the AGU generates an LSU address using forwarded register ports, and may further perform branch forwarding (e.g., immediate offset branch forwarding, LR register branch forwarding, etc.). The decode unit circuitry 340 may be implemented using various different mechanisms. Examples of suitable mechanisms include, but are not limited to, look-up tables, hardware implementations, programmable logic arrays (PLAs), microcode read only memories (ROMs), etc. In one embodiment, the core 390 includes a microcode ROM (not shown) or other medium that stores microcode for certain macroinstructions (e.g., in decode unit circuitry 340 or otherwise within the front end unit circuitry 330). In one embodiment, the decode unit circuitry 340 includes a micro-operation (micro-op) or operation cache (not shown) to hold/cache decoded operations, micro-tags, or micro-operations generated during the decode or other stages of the processor pipeline 300. The decode unit circuitry 340 may be coupled to rename/allocator unit circuitry 352 in the execution engine unit circuitry 350.

The execution engine circuitry 350 includes the rename/allocator unit circuitry 352 coupled to a retirement unit circuitry 354 and a set of one or more scheduler(s) circuitry 356. The scheduler(s) circuitry 356 represents any number of different schedulers, including reservations stations, central instruction window, etc. In some embodiments, the scheduler(s) circuitry 356 can include arithmetic logic unit (ALU) scheduler/scheduling circuitry, ALU queues, arithmetic generation unit (AGU) scheduler/scheduling circuitry, AGU queues, etc. The scheduler(s) circuitry 356 is coupled to the physical register file(s) circuitry 358. Each of the physical register file(s) circuitry 358 represents one or more physical register files, different ones of which store one or more different data types, such as scalar integer, scalar floating-point, packed integer, packed floating-point, vector integer, vector floating-point, status (e.g., an instruction pointer that is the address of the next instruction to be executed), etc. In one embodiment, the physical register file(s) unit circuitry 358 includes vector registers unit circuitry, writemask registers unit circuitry, and scalar register unit circuitry. These register units may provide architectural vector registers, vector mask registers, general-purpose registers, etc. The physical register file(s) unit(s) circuitry 358 is overlapped by the retirement unit circuitry 354 (also known as a retire queue or a retirement queue) to illustrate various ways in which register renaming and out-of-order execution may be implemented (e.g., using a reorder buffer(s) (ROB(s)) and a retirement register file(s); using a future file(s), a history buffer(s), and a retirement register file(s); using a register maps and a pool of registers; etc.). The retirement unit circuitry 354 and the physical register file(s) circuitry 358 are coupled to the execution cluster(s) 360. The execution cluster(s) 360 includes a set of one or more execution units circuitry 362 and a set of one or more memory access circuitry 364. The execution units circuitry 362 may perform various arithmetic, logic, floating-point or other types of operations (e.g., shifts, addition, subtraction, multiplication) and on various types of data (e.g., scalar floating-point, packed integer, packed floating-point, vector integer, vector floating-point). While some embodiments may include a number of execution units or execution unit circuitry dedicated to specific functions or sets of functions, other embodiments may include only one execution unit circuitry or multiple execution units/execution unit circuitry that all perform all functions. The scheduler(s) circuitry 356, physical register file(s) unit(s) circuitry 358, and execution cluster(s) 360 are shown as being possibly plural because certain embodiments create separate pipelines for certain types of data/operations (e.g., a scalar integer pipeline, a scalar floating-point/packed integer/packed floating-point/vector integer/vector floating-point pipeline, and/or a memory access pipeline that each have their own scheduler circuitry, physical register file(s) unit circuitry, and/or execution cluster—and in the case of a separate memory access pipeline, certain embodiments are implemented in which only the execution cluster of this pipeline has the memory access unit(s) circuitry 364). It should also be understood that where separate pipelines are used, one or more of these pipelines may be out-of-order issue/execution and the rest in-order.

In some embodiments, the execution engine unit circuitry 350 may perform load store unit (LSU) address/data pipelining to an Advanced Microcontroller Bus (AHB) interface (not shown), and address phase and writeback, data phase load, store, and branches.

The set of memory access circuitry 364 is coupled to the memory unit circuitry 370, which includes data TLB unit circuitry 372 coupled to a data cache circuitry 374 coupled to a level 2 (L2) cache circuitry 376. In one exemplary embodiment, the memory access units circuitry 364 may include a load unit circuitry, a store address unit circuit, and a store data unit circuitry, each of which is coupled to the data TLB circuitry 372 in the memory unit circuitry 370. The instruction cache circuitry 334 is further coupled to a level 2 (L2) cache unit circuitry 376 in the memory unit circuitry 370. In one embodiment, the instruction cache 334 and the data cache 374 are combined into a single instruction and data cache (not shown) in L2 cache unit circuitry 376, a level 3 (L3) cache unit circuitry (not shown), and/or main memory. The L2 cache unit circuitry 376 is coupled to one or more other levels of cache and eventually to a main memory.

The core 390 may support one or more instructions sets (e.g., the x86 instruction set (with some extensions that have been added with newer versions); the MIPS instruction set; the ARM instruction set (with optional additional extensions such as NEON)), including the instruction(s) described herein. In one embodiment, the core 390 includes logic to support a packed data instruction set extension (e.g., AVX1, AVX2), thereby allowing the operations used by many multimedia applications to be performed using packed data.

Exemplary Execution Unit(s) Circuitry

Figure 4:
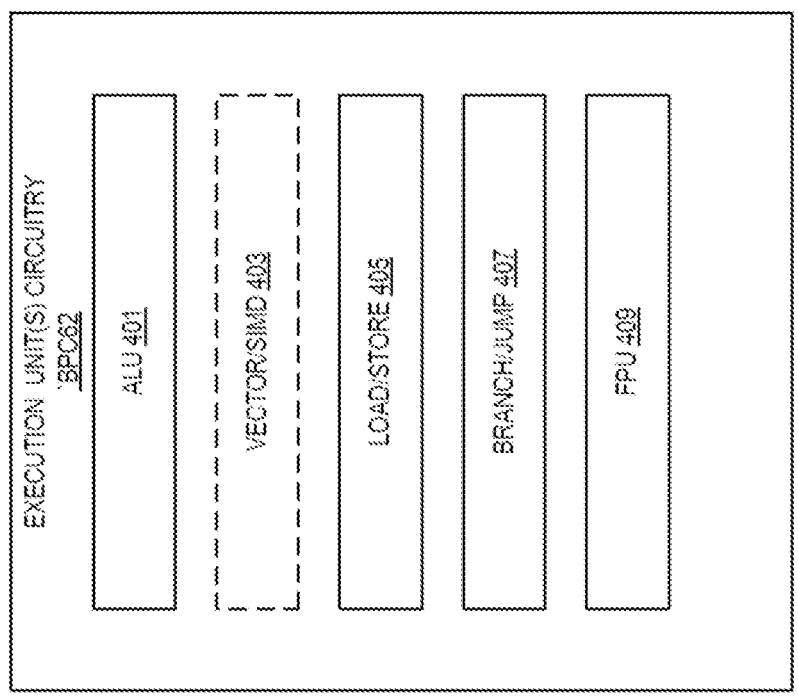
FIG. 4 illustrates execution circuitry in accordance with one embodiment.

FIG. 4 illustrates embodiments of execution unit(s) circuitry, such as execution unit(s) circuitry 362 of FIG. 3(B). As illustrated, execution unit(s) circuitry 362 may include one or more ALU circuits 401, vector/SIMD unit circuits 403, load/store unit circuits 405, and/or branch/jump unit circuits 407. ALU circuits 401 perform integer arithmetic and/or Boolean operations. Vector/SIMD unit circuits 403 perform vector/SIMD operations on packed data (such as SIMD/vector registers). Load/store unit circuits 405 execute load and store instructions to load data from memory into registers or store from registers to memory. Load/store unit circuits 405 may also generate addresses. Branch/jump unit circuits 407 cause a branch or jump to a memory address depending on the instruction. Floating-point unit (FPU) circuits 409 perform floating-point arithmetic. The width of the execution unit(s) circuitry 362 varies depending upon the embodiment and can range from 16-bit to 1,024-bit. In some embodiments, two or more smaller execution units are logically combined to form a larger execution unit (e.g., two 128-bit execution units are logically combined to form a 256-bit execution unit).

Exemplary Register Architecture

Figure 5:
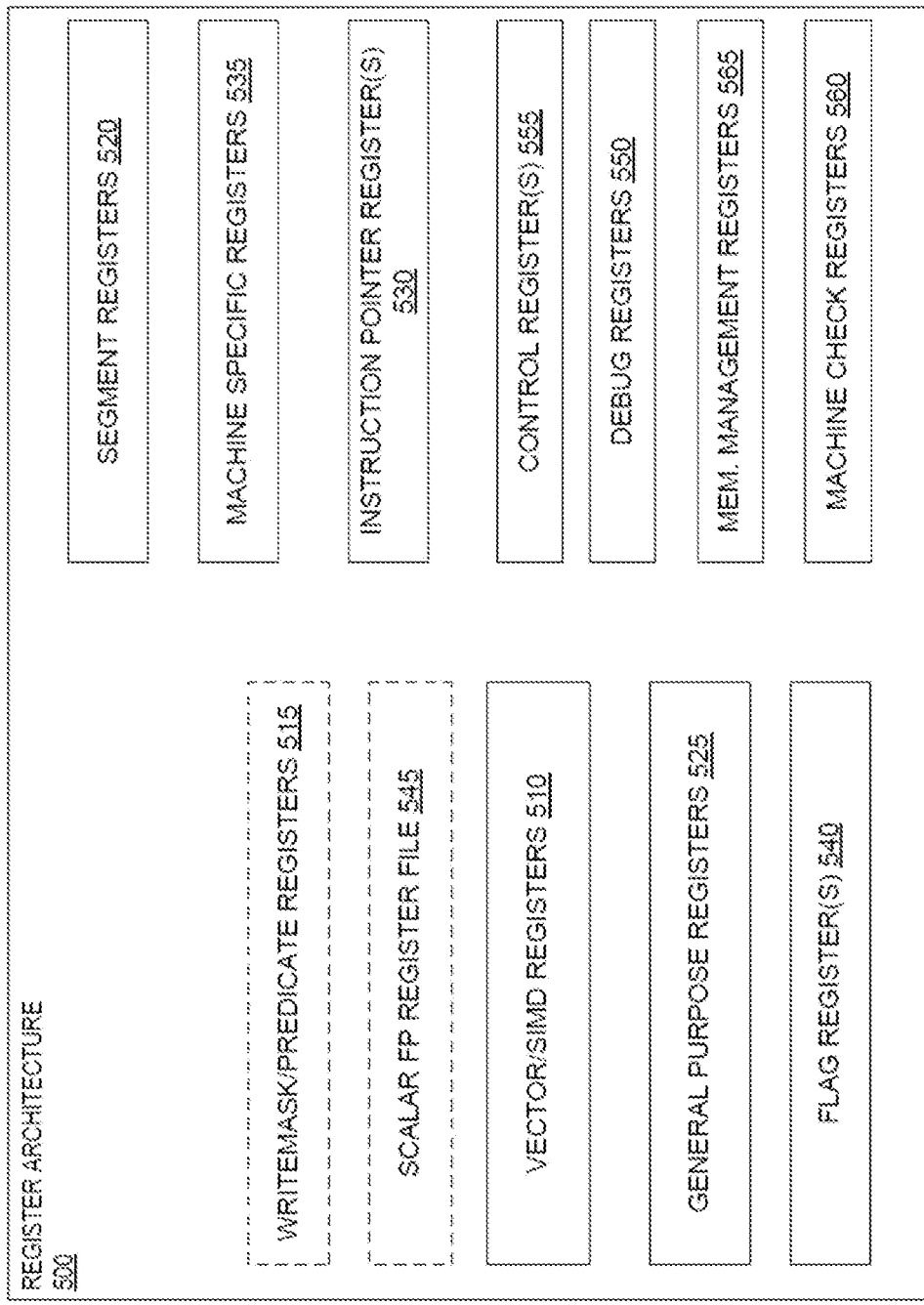
FIG. 5 illustrates one embodiment of a register architecture.

FIG. 5 is a block diagram of a register architecture 500 according to some embodiments. As illustrated, there are vector/SIMD registers 510 that vary from 128-bit to 1,024 bits width. In some embodiments, the vector/SIMD registers 510 are physically 512-bits and, depending upon the mapping, only some of the lower bits are used. For example, in some embodiments, the vector/SIMD registers 510 are ZMM registers which are 512 bits: the lower 256 bits are used for YMM registers and the lower 128 bits are used for XMM registers. As such, there is an overlay of registers. In some embodiments, a vector length field selects between a maximum length and one or more other shorter lengths, where each such shorter length is half the length of the preceding length. Scalar operations are operations performed on the lowest order data element position in a ZMM/YMM/XMM register; the higher order data element positions are either left the same as they were prior to the instruction or zeroed depending on the embodiment.

In some embodiments, the register architecture 500 includes writemask/predicate registers 515. For example, in some embodiments, there are 8 writemask/predicate registers (sometimes called k0 through k7) that are each 16-bit, 32-bit, 64-bit, or 128-bit in size. Writemask/predicate registers 515 may allow for merging (e.g., allowing any set of elements in the destination to be protected from updates during the execution of any operation) and/or zeroing (e.g., zeroing vector masks allow any set of elements in the destination to be zeroed during the execution of any operation). In some embodiments, each data element position in a given writemask/predicate register 515 corresponds to a data element position of the destination. In other embodiments, the writemask/predicate registers 515 are scalable and consists of a set number of enable bits for a given vector element (e.g., 8 enable bits per 64-bit vector element).

The register architecture 500 includes a plurality of general-purpose registers 525. These registers may be 16-bit, 32-bit, 64-bit, etc. and can be used for scalar operations. In some embodiments, these registers are referenced by the names RAX, RBX, RCX, RDX, RBP, RSI, RDI, RSP, and R8 through R15.

In some embodiments, the register architecture 500 includes scalar floating-point register 545 which is used for scalar floating-point operations on 32/64/80-bit floating-point data using the x87 instruction set extension or as MMX registers to perform operations on 64-bit packed integer data, as well as to hold operands for some operations performed between the MMX and XMM registers.

One or more flag registers 540 (e.g., EFLAGS, RFLAGS, etc.) store status and control information for arithmetic, compare, and system operations. For example, the one or more flag registers 540 may store condition code information such as carry, parity, auxiliary carry, zero, sign, and overflow. In some embodiments, the one or more flag registers 540 are called program status and control registers.

Segment registers 520 contain segment points for use in accessing memory. In some embodiments, these registers are referenced by the names CS, DS, SS, ES, FS, and GS.

Machine specific registers (MSRs) 535 control and report on processor performance. Most MSRs 535 handle system-related functions and are not accessible to an application program. Machine check registers 560 consist of control, status, and error reporting MSRs that are used to detect and report on hardware errors.

One or more instruction pointer register(s) 530 store an instruction pointer value. Control register(s) 555 (e.g., CR0-CR4) determine the operating mode of a processor (e.g., processor 170, 180, 138, 115, and/or 200) and the characteristics of a currently executing task. Debug registers 550 control and allow for the monitoring of a processor or core's debugging operations.

Memory management registers 565 specify the locations of data structures used in protected mode memory management. These registers may include a GDTR, IDRT, task register, and a LDTR register.

Alternative embodiments of the invention may use wider or narrower registers. Additionally, alternative embodiments of the invention may use more, less, or different register files and registers.

Instruction Sets

An instruction set architecture (ISA) may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or sub-formats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands.

Exemplary Instruction Formats

Embodiments of the instruction(s) described herein may be embodied in different formats. Additionally, exemplary systems, architectures, and pipelines are detailed below. Embodiments of the instruction(s) may be executed on such systems, architectures, and pipelines, but are not limited to those detailed.

Figure 6:
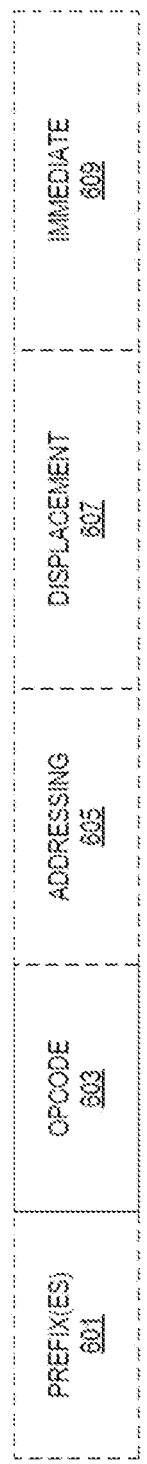
FIG. 6 illustrates one example of an instruction format.

FIG. 6 illustrates embodiments of an instruction format. As illustrated, an instruction may include multiple components including, but not limited to, one or more fields for: one or more prefixes 601, an opcode 603, addressing information 605 (e.g., register identifiers, memory addressing information, etc.), a displacement value 607, and/or an immediate 609. Note that some instructions utilize some or all of the fields of the format whereas others may only use the field for the opcode 603. In some embodiments, the order illustrated is the order in which these fields are to be encoded, however, it should be appreciated that in other embodiments these fields may be encoded in a different order, combined, etc.

The prefix(es) field(s) 601, when used, modifies an instruction. In some embodiments, one or more prefixes are used to repeat string instructions (e.g., 0xF0, 0xF2, 0xF3, etc.), to provide section overrides (e.g., 0x2E, 0x36, 0x3E, 0x26, 0x64, 0x65, 0x2E, 0x3E, etc.), to perform bus lock operations, and/or to change operand (e.g., 0x66) and address sizes (e.g., 0x67). Certain instructions require a mandatory prefix (e.g., 0x66, 0xF2, 0xF3, etc.). Certain of these prefixes may be considered "legacy" prefixes. Other prefixes, one or more examples of which are detailed herein, indicate, and/or provide further capability, such as specifying particular registers, etc. The other prefixes typically follow the "legacy" prefixes.

The opcode field 603 is used to at least partially define the operation to be performed upon a decoding of the instruction. In some embodiments, a primary opcode encoded in the opcode field 603 is 1, 2, or 3 bytes in length. In other embodiments, a primary opcode can be a different length. An additional 3-bit opcode field is sometimes encoded in another field.

Figure 7:
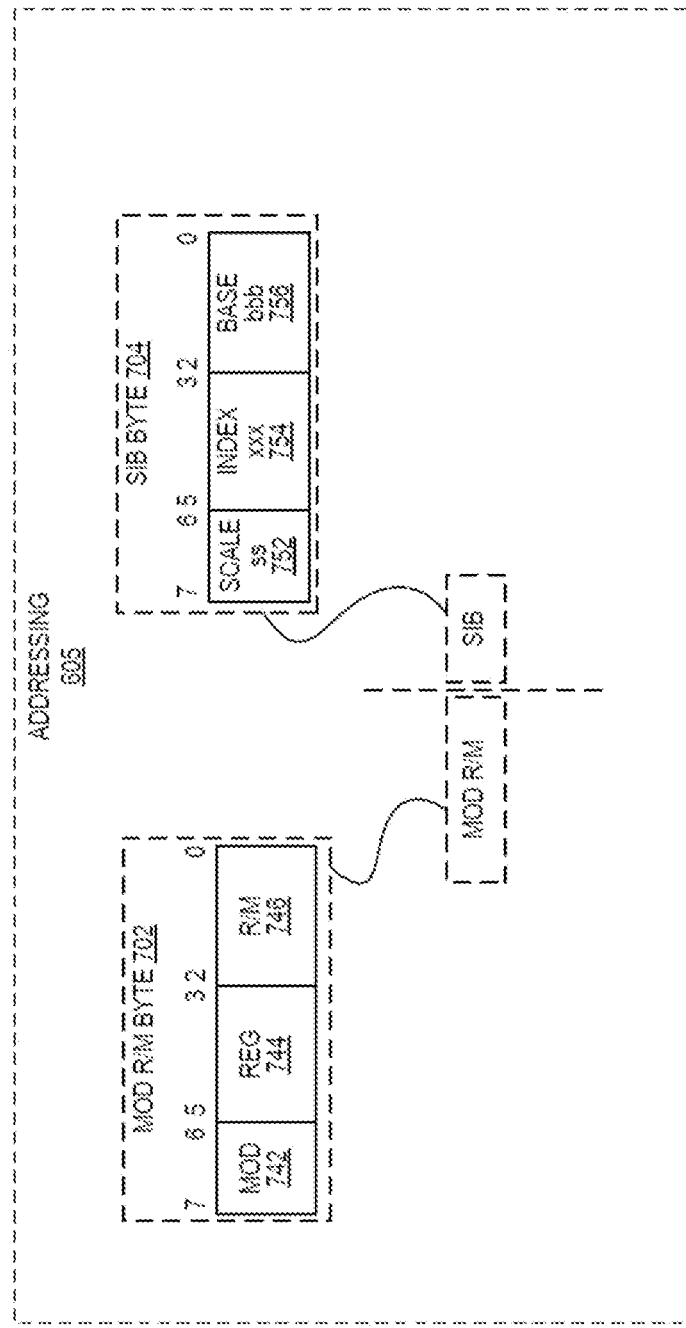
FIG. 7 illustrates addressing techniques in accordance with one embodiment.

The addressing field 605 is used to address one or more operands of the instruction, such as a location in memory or one or more registers. FIG. 7 illustrates embodiments of the addressing field 605. In this illustration, an optional ModR/M byte 702 and an optional Scale, Index, Base (SIB) byte 704 are shown. The ModR/M byte 702 and the SIB byte 704 are used to encode up to two operands of an instruction, each of which is a direct register or effective memory address. Note that each of these fields are optional in that not all instructions include one or more of these fields. The MOD R/M byte 702 includes a MOD field 742, a register field 744, and R/M field 746.

The content of the MOD field 742 distinguishes between memory access and non-memory access modes. In some embodiments, when the MOD field 742 has a value of b11, a register-direct addressing mode is utilized, and otherwise register-indirect addressing is used.

The register field 744 may encode either the destination register operand or a source register operand, or may encode an opcode extension and not be used to encode any instruction operand. The content of register index field 744, directly or through address generation, specifies the locations of a source or destination operand (either in a register or in memory). In some embodiments, the register field 744 is supplemented with an additional bit from a prefix (e.g., prefix 601) to allow for greater addressing.

The R/M field 746 may be used to encode an instruction operand that references a memory address, or may be used to encode either the destination register operand or a source register operand. Note the R/M field 746 may be combined with the MOD field 742 to dictate an addressing mode in some embodiments.

The SIB byte 704 includes a scale field 752, an index field 754, and a base field 756 to be used in the generation of an address. The scale field 752 indicates scaling factor. The index field 754 specifies an index register to use. In some embodiments, the index field 754 is supplemented with an additional bit from a prefix (e.g., prefix 601) to allow for greater addressing. The base field 756 specifies a base register to use. In some embodiments, the base field 756 is supplemented with an additional bit from a prefix (e.g., prefix 601) to allow for greater addressing. In practice, the content of the scale field 752 allows for the scaling of the content of the index field 754 for memory address generation (e.g., for address generation that uses $2^{scale}*\text{index}+\text{base}$).

Some addressing forms utilize a displacement value to generate a memory address. For example, a memory address may be generated according to $2^{scale}*\text{index}+\text{base}+\text{displacement}$, index*scale+displacement, r/m+displacement, instruction pointer (RIP/EIP)+displacement, register+displacement, etc. The displacement may be a 1-byte, 2-byte, 4-byte, etc. value. In some embodiments, a displacement field 607 provides this value. Additionally, in some embodiments, a displacement factor usage is encoded in the MOD field of the addressing field 605 that indicates a compressed displacement scheme for which a displacement value is calculated by multiplying disp8 in conjunction with a scaling factor N that is determined based on the vector length, the value of a b bit, and the input element size of the instruction. The displacement value is stored in the displacement field 607.

In some embodiments, an immediate field 609 specifies an immediate for the instruction. An immediate may be encoded as a 1-byte value, a 2-byte value, a 4-byte value, etc.

FIG. 8 illustrates embodiments of a first prefix 601(A). In some embodiments, the first prefix 601(A) is an embodiment of a REX prefix. Instructions that use this prefix may specify general purpose registers, 64-bit packed data registers (e.g., single instruction, multiple data (SIMD) registers or vector registers), and/or control registers and debug registers (e.g., CR8-CR15 and DR8-DR15).

Instructions using the first prefix 601(A) may specify up to three registers using 3-bit fields depending on the format: 1) using the reg field 744 and the R/M field 746 of the Mod R/M byte 702; 2) using the Mod R/M byte 702 with the SIB byte 704 including using the reg field 744 and the base field 756 and index field 754; or 3) using the register field of an opcode.

In the first prefix 601(A), bit positions 7:4 are set as 0100. Bit position 3 (W) can be used to determine the operand size, but may not solely determine operand width. As such, when W=0, the operand size is determined by a code segment descriptor (CS.D) and when W=1, the operand size is 64-bit.

Note that the addition of another bit allows for 16 ($2^4$) registers to be addressed, whereas the MOD R/M reg field 744 and MOD R/M R/M field 746 alone can each only address 8 registers.

In the first prefix 601(A), bit position 2 (R) may an extension of the MOD R/M reg field 744 and may be used to modify the ModR/M reg field 744 when that field encodes a general purpose register, a 64-bit packed data register (e.g., a SSE register), or a control or debug register. R is ignored when Mod R/M byte 702 specifies other registers or defines an extended opcode.

Bit position 1 (X) X bit may modify the SIB byte index field 754.

Bit position B (B) B may modify the base in the Mod R/M R/M field 746 or the SIB byte base field 756; or it may modify the opcode register field used for accessing general purpose registers (e.g., general purpose registers 525).

FIGS. 9(A)-(D) illustrate embodiments of how the R, X, and B fields of the first prefix 601(A) are used. FIG. 9(A) illustrates R and B from the first prefix 601(A) being used to extend the reg field 744 and R/M field 746 of the MOD R/M byte 702 when the SIB byte 7 04 is not used for memory addressing. FIG. 9(B) illustrates R and B from the first prefix 601(A) being used to extend the reg field 744 and R/M field 746 of the MOD R/M byte 702 when the SIB byte 7 04 is not used (register-register addressing). FIG. 9(C) illustrates R, X, and B from the first prefix 601(A) being used to extend the reg field 744 of the MOD R/M byte 702 and the index field 754 and base field 756 when the SIB byte 7 04 being used for memory addressing. FIG. 9(D) illustrates B from the first prefix 601(A) being used to extend the reg field 744 of the MOD R/M byte 702 when a register is encoded in the opcode 603.

Figure 10A:
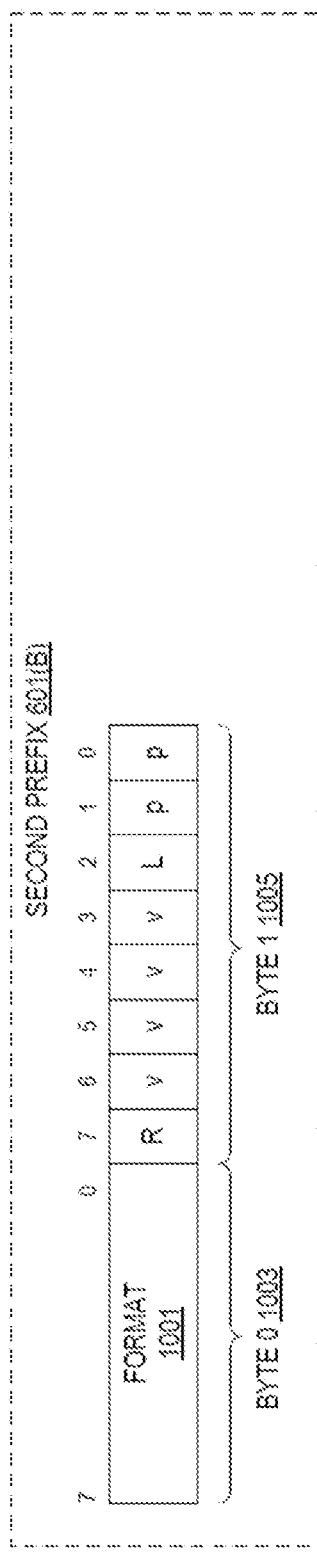
FIGS. 10A-B illustrate examples of a second instruction prefix.
Figure 10B:
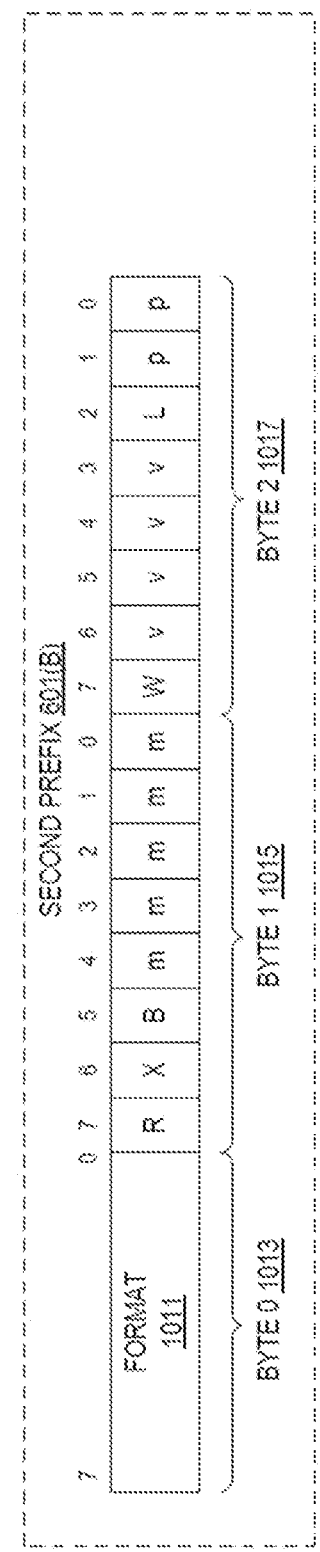

FIGS. 10(A)-(B) illustrate embodiments of a second prefix 601(B). In some embodiments, the second prefix 601(B) is an embodiment of a VEX prefix. The second prefix 601(B) encoding allows instructions to have more than two operands, and allows SIMD vector registers (e.g., vector/SIMD registers 510) to be longer than 64-bits (e.g., 128-bit and 256-bit). The use of the second prefix 601(B) provides for three-operand (or more) syntax. For example, previous two-operand instructions performed operations such as A=A+B, which overwrites a source operand. The use of the second prefix 601(B) enables operands to perform nondestructive operations such as A=B+C.

In some embodiments, the second prefix 601(B) comes in two forms—a two-byte form and a three-byte form. The two-byte second prefix 601(B) is used mainly for 128-bit, scalar, and some 256-bit instructions; while the three-byte second prefix 601(B) provides a compact replacement of the first prefix 601(A) and 3-byte opcode instructions.

FIG. 10(A) illustrates embodiments of a two-byte form of the second prefix 601(B). In one example, a format field 1001 (byte 0 1003) contains the value C5H. In one example, byte 1 1005 includes a "R" value in bit[7]. This value is the complement of the same value of the first prefix 601(A). Bit[2] is used to dictate the length (L) of the vector (where a value of 0 is a scalar or 128-bit vector and a value of 1 is a 256-bit vector). Bits[1:0] provide opcode extensionality equivalent to some legacy prefixes (e.g., 00=no prefix, 01=66H, 10=F3H, and 11=F2H). Bits[6:3] shown as vvvv may be used to: 1) encode the first source register operand, specified in inverted (1 s complement) form and valid for instructions with 2 or more source operands; 2) encode the destination register operand, specified in 1 s complement form for certain vector shifts; or 3) not encode any operand, the field is reserved and should contain a certain value, such as 1111b.

Instructions that use this prefix may use the Mod R/M R/M field 746 to encode the instruction operand that references a memory address or encode either the destination register operand or a source register operand.

Instructions that use this prefix may use the Mod R/M reg field 744 to encode either the destination register operand or a source register operand, be treated as an opcode extension and not used to encode any instruction operand.

For instruction syntax that support four operands, vvvv, the Mod R/M R/M field 746 and the Mod R/M reg field 744 encode three of the four operands. Bits[7:4] of the immediate 609 are then used to encode the third source register operand.

FIG. 10(B) illustrates embodiments of a three-byte form of the second prefix 601(B). in one example, a format field 1011 (byte 0 1013) contains the value C4H. Byte 1 1015 includes in bits[7:5] "R," "X," and "B" which are the complements of the same values of the first prefix 601(A). Bits[4:0] of byte 1 1015 (shown as mmmmm) include content to encode, as need, one or more implied leading opcode bytes. For example, 00001 implies a 0FH leading opcode, 00010 implies a 0F38H leading opcode, 00011 implies a leading 0F3AH opcode, etc.

Bit[7] of byte 2 1017 is used similar to W of the first prefix 601(A) including helping to determine promotable operand sizes. Bit[2] is used to dictate the length (L) of the vector (where a value of 0 is a scalar or 128-bit vector and a value of 1 is a 256-bit vector). Bits[1:0] provide opcode extensionality equivalent to some legacy prefixes (e.g., 00=no prefix, 01=66H, 10=F3H, and 11=F2H). Bits[6:3], shown as vvvv, may be used to: 1) encode the first source register operand, specified in inverted (1s complement) form and valid for instructions with 2 or more source operands; 2) encode the destination register operand, specified in 1s complement form for certain vector shifts; or 3) not encode any operand, the field is reserved and should contain a certain value, such as 1111b.

Instructions that use this prefix may use the Mod R/M R/M field 746 to encode the instruction operand that references a memory address or encode either the destination register operand or a source register operand.

Instructions that use this prefix may use the Mod R/M reg field 744 to encode either the destination register operand or a source register operand, be treated as an opcode extension and not used to encode any instruction operand.

For instruction syntax that support four operands, vvvv, the Mod R/M R/M field 746, and the Mod R/M reg field 744 encode three of the four operands. Bits[7:4] of the immediate 609 are then used to encode the third source register operand.

Figure 11:
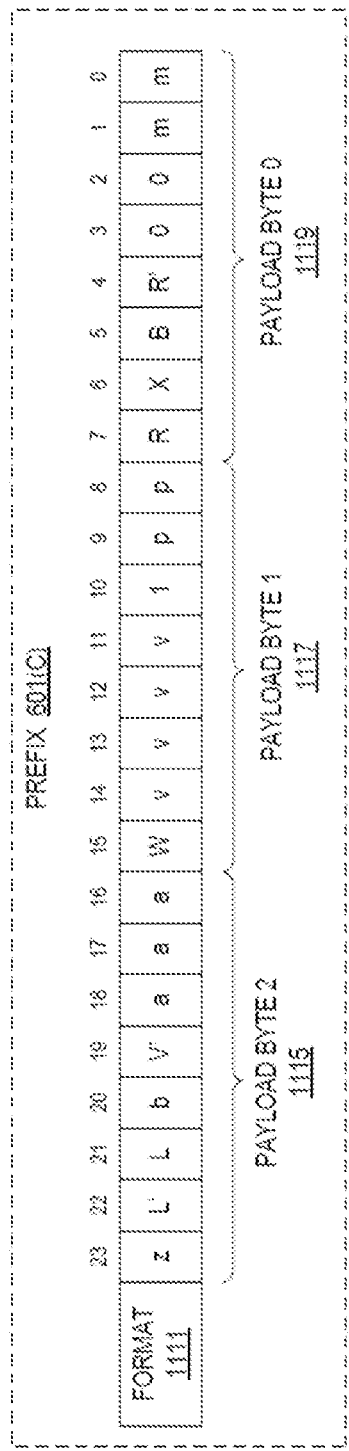
FIG. 11 illustrates payload bytes of one embodiment of an instruction prefix.

FIG. 11 illustrates embodiments of a third prefix 601(C). In some embodiments, the first prefix 601(A) is an embodiment of an EVEX prefix. The third prefix 601(C) is a four-byte prefix.

The third prefix 601(C) can encode 32 vector registers (e.g., 128-bit, 256-bit, and 512-bit registers) in 64-bit mode. In some embodiments, instructions that utilize a writemask/opmask (see discussion of registers in a previous figure, such as FIG. 5) or predication utilize this prefix. Opmask register allow for conditional processing or selection control. Opmask instructions, whose source/destination operands are opmask registers and treat the content of an opmask register as a single value, are encoded using the second prefix 601(B).

The third prefix 601(C) may encode functionality that is specific to instruction classes (e.g., a packed instruction with "load+op" semantic can support embedded broadcast functionality, a floating-point instruction with rounding semantic can support static rounding functionality, a floating-point instruction with non-rounding arithmetic semantic can support "suppress all exceptions" functionality, etc.).

The first byte of the third prefix 601(C) is a format field 1111 that has a value, in one example, of 62H. Subsequent bytes are referred to as payload bytes 1115-1119 and collectively form a 24-bit value of P[23:0] providing specific capability in the form of one or more fields (detailed herein).

In some embodiments, P[1:0] of payload byte 1119 are identical to the low two mmmmm bits. P[3:2] are reserved in some embodiments. Bit P[4] (R') allows access to the high 16 vector register set when combined with P[7] and the ModR/M reg field 744. P[6] can also provide access to a high 16 vector register when SIB-type addressing is not needed. P[7:5] consist of an R, X, and B which are operand specifier modifier bits for vector register, general purpose register, memory addressing and allow access to the next set of 8 registers beyond the low 8 registers when combined with the ModR/M register field 744 and ModR/M R/M field 746. P[9:8] provide opcode extensionality equivalent to some legacy prefixes (e.g., 00=no prefix, 01=66H, 10=F3H, and 11=F2H). P[10] in some embodiments is a fixed value of 1. P[14:11], shown as vvvv, may be used to: 1) encode the first source register operand, specified in inverted (1s complement) form and valid for instructions with 2 or more source operands; 2) encode the destination register operand, specified in 1s complement form for certain vector shifts; or 3) not encode any operand, the field is reserved and should contain a certain value, such as 1111b.

P[15] is similar to W of the first prefix 601(A) and second prefix 611(B) and may serve as an opcode extension bit or operand size promotion.

P[18:16] specify the index of a register in the opmask (writemask) registers (e.g., writemask/predicate registers 515). In one embodiment of the invention, the specific value aaa=000 has a special behavior implying no opmask is used for the particular instruction (this may be implemented in a variety of ways including the use of a opmask hardwired to all ones or hardware that bypasses the masking hardware). When merging, vector masks allow any set of elements in the destination to be protected from updates during the execution of any operation (specified by the base operation and the augmentation operation); in other one embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the opmask field allows for partial vector operations, including loads, stores, arithmetic, logical, etc. While embodiments of the invention are described in which the opmask field's content selects one of a number of opmask registers that contains the opmask to be used (and thus the opmask field's content indirectly identifies that masking to be performed), alternative embodiments instead or additional allow the mask write field's content to directly specify the masking to be performed.

P[19] can be combined with P[14:11] to encode a second source vector register in a non-destructive source syntax which can access an upper 16 vector registers using P[19]. P[20] encodes multiple functionalities, which differs across different classes of instructions and can affect the meaning of the vector length/rounding control specifier field (P[22:21]). P[23] indicates support for merging-writemasking (e.g., when set to 0) or support for zeroing and merging-writemasking (e.g., when set to 1).

Exemplary embodiments of encoding of registers in instructions using the third prefix 601(C) are detailed in the following tables.

TABLE 1

32-Register Support in 64-bit Mode

| | 4 | 3 | [2:0] | REG. TYPE | COMMON USAGES |
|---|---|---|---|---|---|
| REG | R' | R | ModR/M reg | GPR, Vector | Destination or Source |
| VVVV | V' | | vvvv | GPR, Vector | 2nd Source or Destination |
| RM | X | B | ModR/M R/M | GPR, Vector | 1st Source or Destination |
| BASE | 0 | B | ModR/M R/M | GPR | Memory addressing |
| INDEX | 0 | X | SIB.index | GPR | Memory addressing |
| VIDX | V' | X | SIB.index | Vector | VSIB memory addressing |

TABLE 2

Encoding Register Specifiers in 32-bit Mode

| | [2:0] | REG. TYPE | COMMON USAGES |
|---|---|---|---|
| REG | ModR/M reg | GPR, Vector | Destination or Source |
| VVVV | vvvv | GPR, Vector | $2^{nd}$ Source or Destination |
| RM | ModR/M R/M | GPR, Vector | $1^{st}$ Source or Destination |
| BASE | ModR/M R/M | GPR | Memory addressing |
| INDEX | SIB.index | GPR | Memory addressing |
| VIDX | SIB.index | Vector | VSIB memory addressing |

TABLE 3

Opmask Register Specifier Encoding

| | [2:0] | REG. TYPE | COMMON USAGES |
|---|---|---|---|
| REG | ModR/M Reg | k0-k7 | Source |
| VVVV | vvvv | k0-k7 | $2^{nd}$ Source |
| RM | ModR/M R/M | k0-7 | $1^{st}$ Source |
| {k1} | aaa | $k0^1$-k7 | Opmask |

Program code may be applied to input instructions to perform the functions described herein and generate output information. The output information may be applied to one or more output devices, in known fashion. For purposes of this application, a processing system includes any system that has a processor, such as, for example, a digital signal processor (DSP), a microcontroller, an application specific integrated circuit (ASIC), or a microprocessor.

The program code may be implemented in a high-level procedural or object-oriented programming language to communicate with a processing system. The program code may also be implemented in assembly or machine language, if desired. In fact, the mechanisms described herein are not limited in scope to any particular programming language. In any case, the language may be a compiled or interpreted language.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 12:
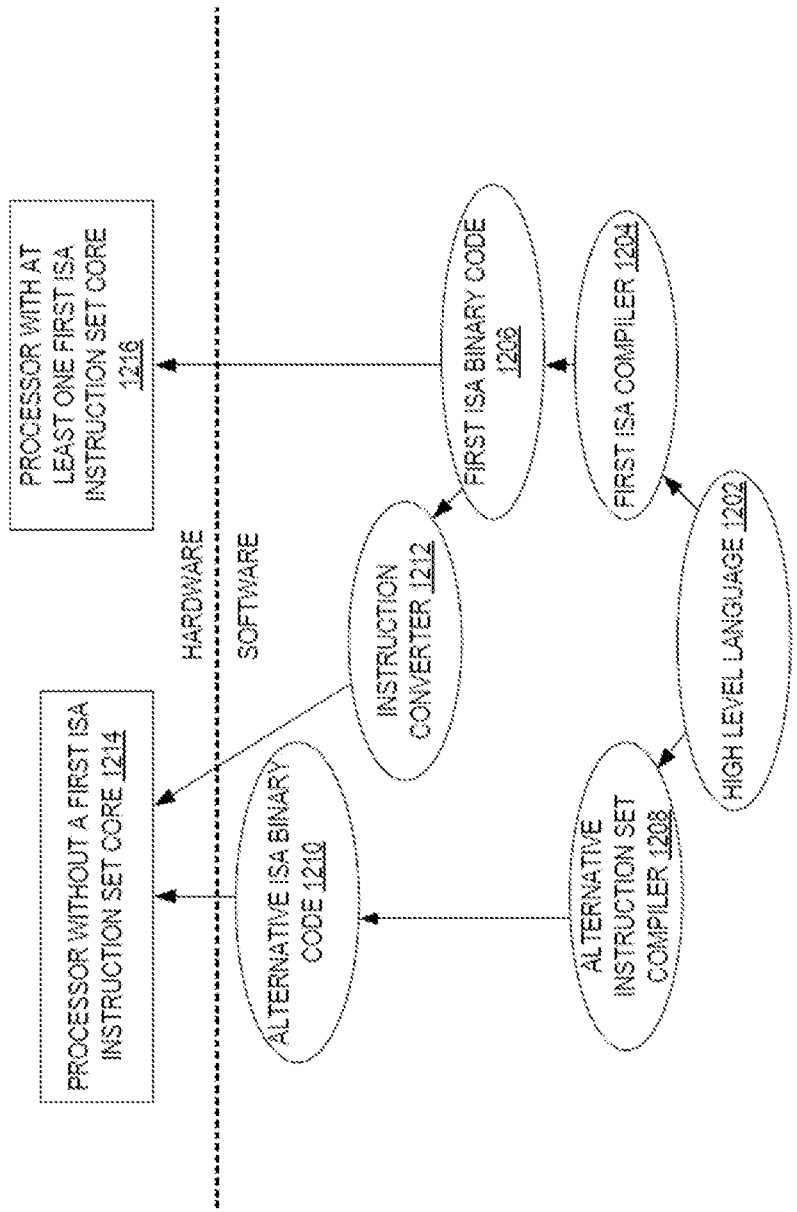
FIG. 12 illustrates instruction conversion and binary translation implementations.

FIG. 12 illustrates a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 12 shows a program in a high level language 1202 may be compiled using a first ISA compiler 1204 to generate first ISA binary code 1206 that may be natively executed by a processor with at least one first instruction set core 1216. The processor with at least one first ISA instruction set core 1216 represents any processor that can perform substantially the same functions as an Intel® processor with at least one first ISA instruction set core by compatibly executing or otherwise processing (1) a substantial portion of the instruction set of the first ISA instruction set core or (2) object code versions of applications or other software targeted to run on an Intel processor with at least one first ISA instruction set core, in order to achieve substantially the same result as a processor with at least one first ISA instruction set core. The first ISA compiler 1204 represents a compiler that is operable to generate first ISA binary code 1206 (e.g., object code) that can, with or without additional linkage processing, be executed on the processor with at least one first ISA instruction set core 1216.

Similarly, FIG. 12 shows the program in the high level language 1202 may be compiled using an alternative instruction set compiler 1208 to generate alternative instruction set binary code 1210 that may be natively executed by a processor without a first ISA instruction set core 1214. The instruction converter 1212 is used to convert the first ISA binary code 1206 into code that may be natively executed by the processor without a first ISA instruction set core 1214. This converted code is not likely to be the same as the alternative instruction set binary code 1210 because an instruction converter capable of this is difficult to make; however, the converted code will accomplish the general operation and be made up of instructions from the alternative instruction set. Thus, the instruction converter 1212 represents software, firmware, hardware, or a combination thereof that, through emulation, simulation or any other process, allows a processor or other electronic device that does not have a first ISA instruction set processor or core to execute the first ISA binary code 1206.

Apparatus and Method for Efficient Deflate Decompression

The Deflate compression format is the most popular compression algorithm currently in use. It is the basis for tools such as gzip and winzip, and such libraries as zlib. It encodes data using Huffman Codes, which are variable-length codes, where more common symbols are encoded using fewer bits, and less common symbols are encoded using more bits. In almost all cases, a custom Huffman code is used for each block of data. To support this, Deflate defines a format for a block, where a block contains a header followed by the compressed data, and the bulk of the header is used to define the Huffman codes to be used for that block.

To save space (and thus to improve the amount of compression), the Huffman code table definitions are themselves compressed in the header. This means that the Huffman code definitions cannot simply be read from the header. Rather, the sizes of the different codes must be extracted, and a set of calculations performed to recreate the codes from these lengths.

The time it takes to parse and process the Deflate header may not be significant when decompressing large files such as files of a megabyte or more in size, but when decompressing small buffers, the time spent decompressing the header can be quite significant. Hence there is a strong desire to minimize this cost.

An increasingly interesting application for compression is tiered memory systems, such as Linux ZSwap. Here, 4 kB memory pages are compressed/decompressed. In this usage, a high-speed hardware decompressor might take roughly 1000 cycles to decompress the body of the block while the header may take 500-700 cycles. Consequently, the header processing time becomes a significant portion of the total decompression time.

Once the header parsing logic has determined the lengths of each of the Huffman Codes, the process of computing the values of the codes is a two-step process, in that it needs to walk the list of code lengths twice. In the first pass, it needs to count how many codes there are of each length. These counts allow the parser to determine what the first code is for each code length. Then it needs to walk that list a second time to actually compute the code values. This second pass cannot begin before the first pass is finished. Since there can up to approximately 300 codes defined, this second pass would typically take up to 300 cycles.

One embodiment of the invention processes the header and compression block in a manner which avoids the second pass, thereby saving all of the associated processing cycles. This embodiment dramatically improves compression performance, particularly when decompressing smaller blocks such as memory pages. One specific implementation includes CAM-based header parsing and ALU-based Huffman Symbol decode.

An overview of one implementation of an ALU-assisted lookup table-based Decompression accelerator will first be provided, followed by a detailed description of the CAM-based header parsing and ALU-based Huffman Symbol decode.

ALU-Assisted Lookup Table-Based Decompression Accelerator

In certain embodiments, Huffman encoding is used in Deflate compression for encoding the length, distance, and literal symbols, as well as end-of-block symbols. In one embodiment, the literal symbols (e.g., values from 0 to 255), for example, used for representing all 8-bit byte patterns, together with the end-of-block symbol and the length symbols (e.g., values 257 to 285), possibly in conjunction with extra bits (EB) following the symbol code, are encoded using a first Huffman code tree. In one embodiment, the distance symbols (e.g., represented by the values from 0 to 29) are encoded as distance codes using a separate, second Huffman code tree. Code trees may be stored in a header of the data block. the literal and length alphabets are merged into a single alphabet (0 . . . 285), where values 0 . . . 255 represent literal bytes, the value 256 indicates end-of-block, and values 257 . . . 285 represent length codes (possibly in conjunction with extra bits following the symbol code).

In one embodiment, every length symbol has two associated values, a base length value and an additional value denoting the number of extra bits to be read from the input bit-stream. The extra bits may be read as an integer which may be added to the base length value to give the absolute length represented by the length symbol occurrence.

In one embodiment, every distance symbol has two associated values, a base distance value and an additional value denoting the number of extra bits to be read from the input bit-stream. The base distance value may be added to the integer made up of the associated number of extra bits from the input bit-stream to give the absolute distance represented by the distance symbol occurrence. In one embodiment, a compressed block of Deflate data is a hybrid of encoded literals and LZ77 look-back indicators terminated by an end-of-block indicator. In one embodiment, Deflate may be used to compress a data stream and "Inflate" may be used to decompress the data stream. Inflate may generally refer to the decoding process that takes a Deflate data stream for decompression (and decoding) and correctly produces the original full-sized data or file. In one embodiment, a data stream is an encoded, compressed Deflate data stream, for example, including a plurality of literal codes (e.g., codewords), length codes (e.g., codewords), and distance codes (e.g., codewords).

Certain embodiments herein provide for a platform scalable and fully synthesizable hardware decompression accelerator that uses a serially decoding assisted look-up table (LUT) to speed up the decode operation during decompression. In certain embodiments, Deflate compression compresses raw data into a stream of literals and length and distance pair symbols that are subsequently Huffman-encoded for optimal compression. In one embodiment, each symbol is represented by a code varying in length from 1b-15b. Certain embodiments herein include a dual circuit design that selectively decodes codes to symbols via a look-up table (LUT)-based second circuit and a compute-intensive serially operating first circuit. In one embodiment, extra shift magnitude computation circuitry is not included in the second circuit and bit shift magnitude compute cycles are not utilized in the first circuit during Huffman decoding.

Certain embodiments herein include a data format for populating a LUT, for example, to eliminate the need for additional shift compute logic from a second circuit. Certain embodiments herein include a first circuit (e.g., ALU) that is to process Huffman codes in any arbitrary order of code lengths (e.g., as opposed to only in order of increasing lengths), which may reduce the first circuit (e.g., slow(er)-path) latency and increase overall throughput. Although the Deflate compression format is discussed throughout this application, the underlying principles of the invention may be implemented with other forms of encoded data (e.g., other forms of Huffman encoded codes, such as, but not limited to, such as in JPEG, MPEG, or other lossless compression algorithms).

In certain embodiments, each symbol in a compressed stream is represented by an encoded Huffman code varying in length from 1 bit(b) to 15 bits(b). Some of the length and distance codes may use a variable number of additional bits (e.g., 0-13b) from the payload that are then concatenated with the Huffman-decoded base during decompression to generate the actual magnitudes of lengths and distances. Thus in certain embodiments, each compressed symbol may vary in length from 1b-28b. In one embodiment, the length of the Huffman code is added to the number of extra bits consumed after the Huffman decode step to generate the bit shift magnitude (e.g., shift amount) for advancing the payload to obtain the next code. Certain embodiments herein include a (e.g., intermediate) data format which stores pre-computed shift amounts (e.g., in the second circuit (e.g., fast-path) LUT), for example, to eliminate any further computation for fetching the next code of the payload.

Certain embodiments herein output an intermediate value for a symbol (e.g., an intermediate value from a LUT for a code). An intermediate value for a symbol (e.g., intermediate symbol) may be converted into the original symbol, for example, by a circuit, such as, but not limited to, those circuits in FIGS. 7 and 8, e.g., and not by an ALU.

Certain embodiments herein of a first circuit (e.g., ALU) decoding of a code to a symbol may include pre-computing the total number of Huffman codes that are less than a given bit length (e.g., code length) in addition to the total number of codes corresponding to that given bit length. In one embodiment, the given bit length is less than a maximum bit length. Certain embodiments herein allow evaluating a code against any arbitrary code length, e.g., as opposed to a code being evaluated against smaller codes first before trying out longer codes (e.g., longer than the given code length). In certain embodiments, by breaking the serial dependency, the first (e.g., ALU) circuit (e.g., slow path) may opportunistically evaluate codes with a higher probability of occurrence early, for example, thereby improving performance as well as energy efficiency by opportunistically avoiding wasteful decode attempts that are to fail (e.g., a majority of the time).

Certain embodiments herein include a literal stream accumulation and record (e.g., a length and distance pair) generation interface (e.g., at the back-end) which may reduce memory usage by storing symbols (e.g., tokens) in a hardware friendly intermediate format, e.g., that may be seamlessly converted into memory load and store instructions for creating uncompressed output.

Certain embodiments herein improve a second circuit (e.g., fast-path) critical path latency by eliminating additional shift computation hardware for fetching the next code of the payload. In one embodiment, the majority (e.g., 95%) of the codes are decoded in the second circuit (e.g., fast-path), for example, where the circuit includes 512 entry LUT(s) to handle codes up to 9b in total length.

Certain embodiments herein provide flexibility to evaluate any arbitrary code length in the first circuit (e.g., ALU) and not only may enable dynamic run-time adaptation for early decode completion (e.g., by evaluating more probable codes early) improving the first (e.g., ALU) circuit (e.g., slow-path) decompression throughput, but also may provide an opportunity for custom look-up table elimination, e.g., enabling a light-weight fully synthesizable (e.g., Deflate) hardware decompression accelerator implementation for area constrained systems (e.g., SoCs). Certain embodiments herein also enable multiple first (e.g., ALU) circuits (e.g., slow-path) to operate in parallel on a payload, for example, as illustrated in FIG. 4B, e.g., providing opportunity for higher throughput. Certain embodiments break a serial dependency by allowing multiple first types of (e.g., ALU) circuits (e.g., slow-path) to evaluate any code length. One embodiment includes multiple first types of (e.g., ALU) circuits (e.g., slow-path), e.g., where each circuit evaluates a different code length. For example, with 15 first types of (e.g., ALU) circuits and one for each code length of 1b-15 bit codes, a system (e.g., accelerator) may evaluate all code lengths from 1b-15 bit (e.g., simultaneously), for example, to complete a decode in 1 to 3 cycles. Such embodiments may or may not include a (e.g., LUT) look-up circuit (e.g., fast-path).

Figure 13:
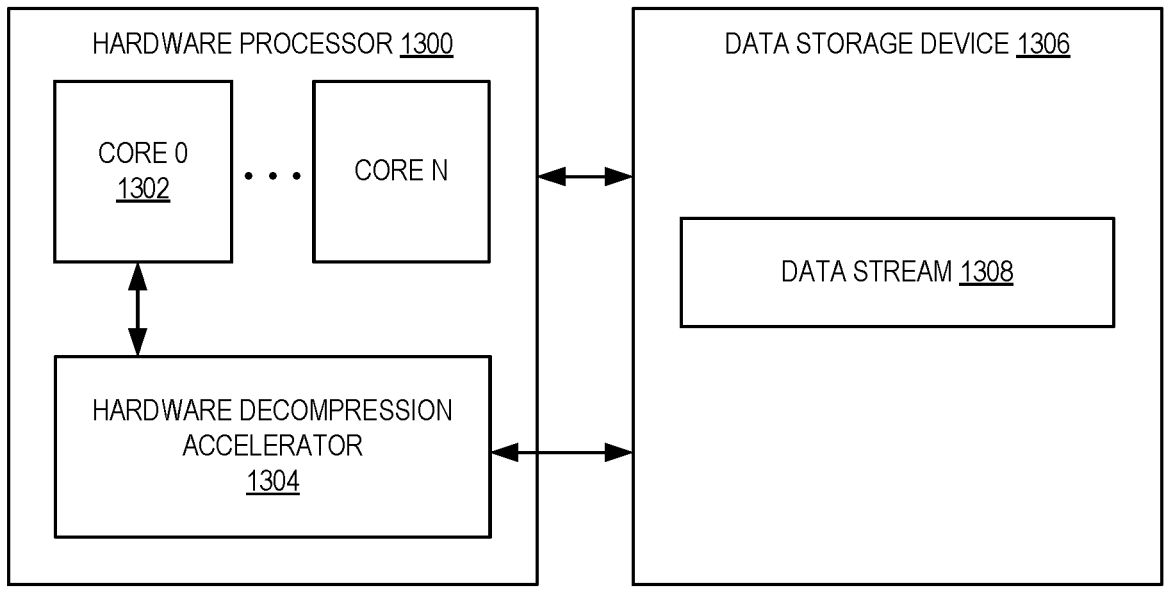
FIG. 13 illustrates a hardware processor with a hardware decompression accelerator according to embodiments of the disclosure.

FIG. 13 illustrates a hardware processor 1300 with a hardware decompression accelerator 1304 according to embodiments of the disclosure. Hardware processor 1300 (e.g., core 1302) may receive a request (e.g., from software) to perform a decompression (e.g., Deflate) thread (e.g., operation) and may offload (e.g., at least part of) the decompression thread (e.g., operation) to a hardware accelerator (e.g., hardware decompression accelerator 1304). Hardware processor 1300 may include one or more cores (0 to N). In one embodiment, each core may communicate with (e.g., be coupled to) hardware decompression accelerator 1304. In one embodiment, each core may communicate with (e.g., be coupled to) one of multiple hardware decompression accelerators. Core(s), accelerator(s), and data storage device 1306 may communicate (e.g., be coupled) with each other. Arrows indicate two way communication (e.g., to and from a component), but one way communication may be used. In one embodiment, a (e.g., each) core may communicate (e.g., be coupled) with the data storage device, for example, storing and/or outputting a data stream 1308. Hardware accelerator may include any hardware (e.g., circuit or circuitry) discussed herein. In one embodiment, an (e.g., each) accelerator may communicate (e.g., be coupled) with the data storage device, for example, to receive an encoded, compressed data stream.

Figure 14:
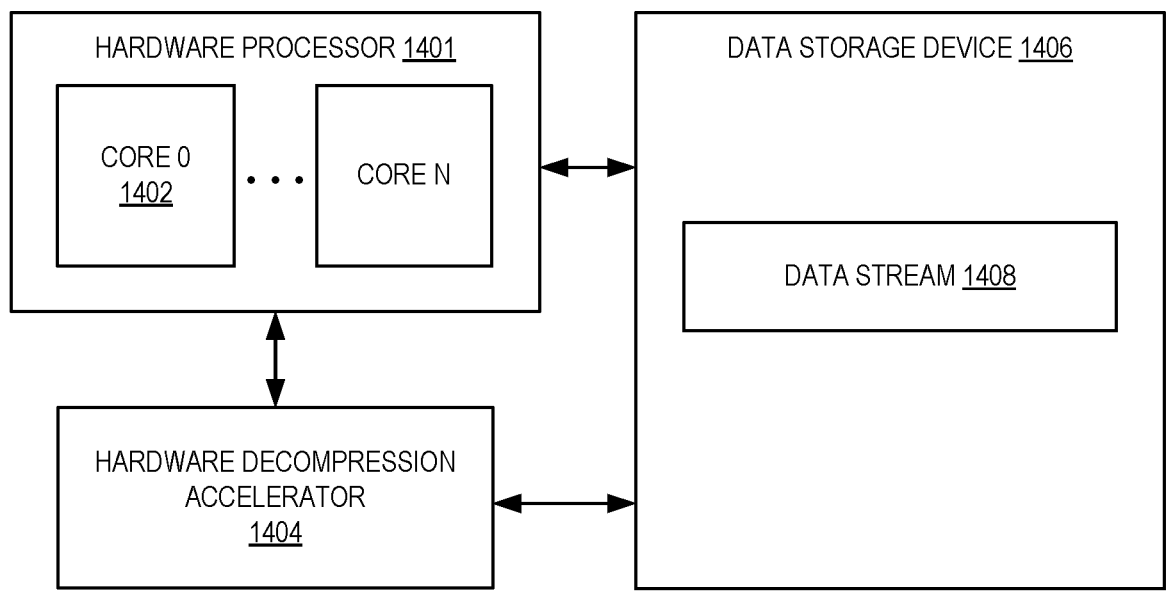
FIG. 14 illustrates a hardware processor and a hardware decompression accelerator according to embodiments of the disclosure.

FIG. 14 illustrates a hardware processor 1401 and a hardware decompression accelerator 1404 according to embodiments of the disclosure. In one embodiment, a hardware decompression accelerator is on die with a hardware processor. In one embodiment, a hardware decompression accelerator is off die of a hardware processor. In one embodiment, system 1400 including at least a hardware processor 1401 and a hardware decompression accelerator 1404 are a SoC. Hardware processor 1401 (e.g., core 1402) may receive a request (e.g., from software) to perform a decompression (e.g., Deflate) thread (e.g., operation) and may offload (e.g., at least part of) the decompression thread (e.g., operation) to a hardware accelerator (e.g., hardware decompression accelerator 1404). Hardware processor 1401 may include one or more cores (0 to N). In one embodiment, each core may communicate with (e.g., be coupled to) hardware decompression accelerator 1404. In one embodiment, each core may communicate with (e.g., be coupled to) one of multiple hardware decompression accelerators. Core(s), accelerator(s), and data storage device 1406 may communicate (e.g., be coupled) with each other. Arrows indicate two way communication (e.g., to and from a component), but one way communication may be used. In one embodiment, a (e.g., each) core may communicate (e.g., be coupled) with the data storage device, for example, storing and/or outputting a data stream 1408. Hardware accelerator may include any hardware (e.g., circuit or circuitry) discussed herein. In one embodiment, an (e.g., each) accelerator may communicate (e.g., be coupled) with the data storage device, for example, to receive an encoded, compressed data stream. Data stream 1408 (e.g., encoded, compressed data stream) may be previously loaded into data storage device 1406, e.g., by a hardware compression accelerator or a hardware processor.

Figure 15:
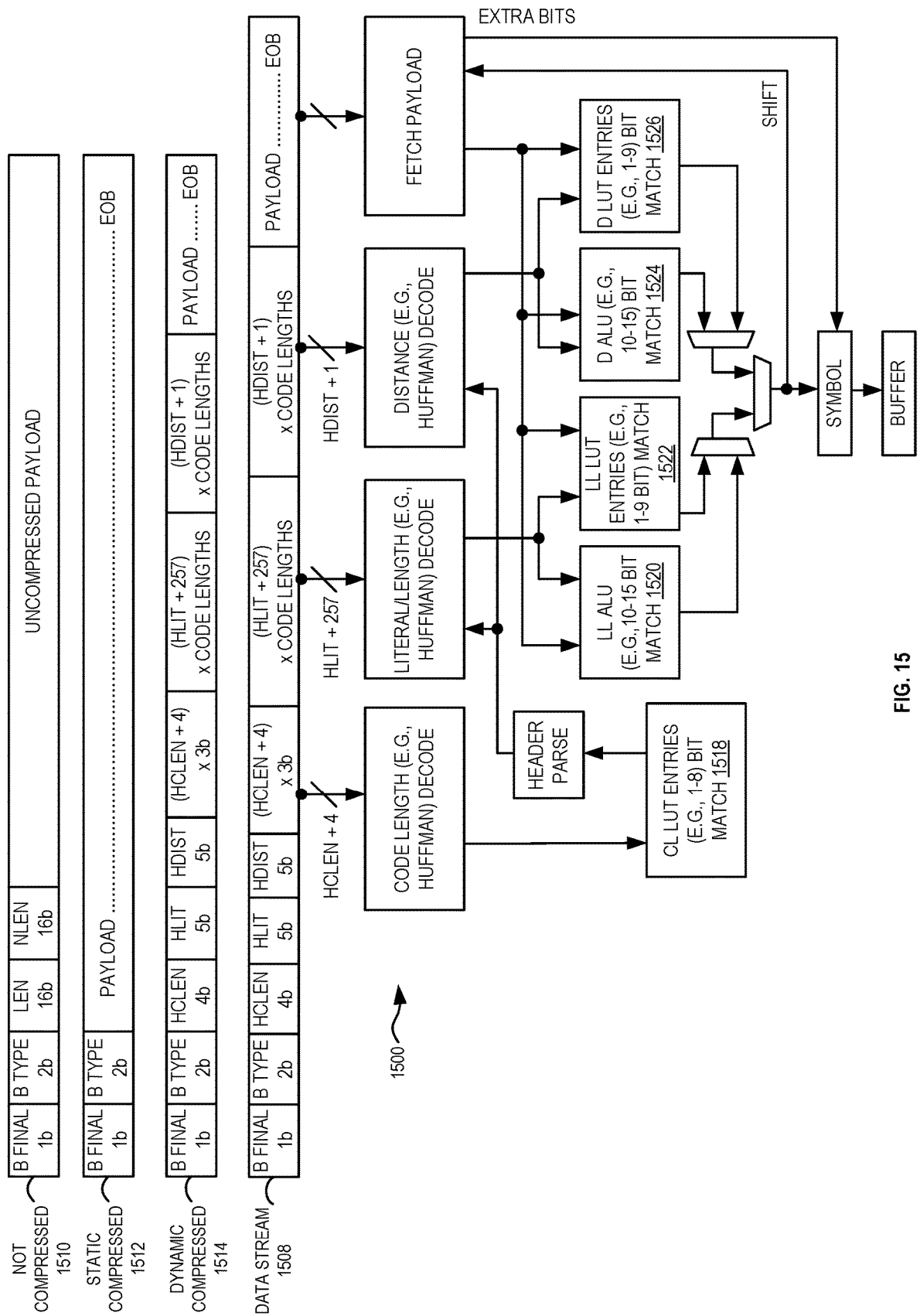
FIG. 15 illustrates a decompression accelerator pipeline according to embodiments of the disclosure.

FIG. 15 illustrates a decompression accelerator pipeline 1500 according to embodiments of the disclosure. Note that the numbers (e.g., number of bits) utilized are examples and other numbers may be utilized. Hardware decompression accelerator 1304 in FIG. 1 and/or hardware decompression accelerator 1404 in FIG. 14 may include decompression accelerator pipeline 1500, e.g., one or more circuits therefrom.

Depicted "not compressed" data stream 1510 includes a block final field (B FINAL) (e.g., as a single bit) to indicate if the block is the last block in the stream (e.g., 1 to indicate that block of data is the last block in the data stream and 0 to indicate there are more blocks to process in the data stream), a block encoding field (e.g., as two bits) to indicate the encoding method used for this block type (e.g., where 00 indicates a stored/raw/literal section (for example, between 0 and 65,535 bytes in length), where 01 indicates a static Huffman compressed block (e.g., using a pre-agreed Huffman tree), 10 indicates a compressed block complete with the Huffman table supplied, and 11 may be reserved for future use), a length field (LEN) (e.g., as 16b) to indicate a length of the uncompressed payload, a not length field (NLEN) (e.g., as 16b) to indicate a 1s complement of the value in the length field (LEN), and an uncompressed payload field to store the uncompressed data.

Depicted static compressed data stream 1512 includes a block final field (B FINAL) (e.g., as a single bit) to indicate if the block is the last block in the stream (e.g., 1 to indicate that block of data is the last block in the data stream and 0 to indicate there are more blocks to process in the data stream), a block encoding field (e.g., as two bits) to indicate the encoding method used for this block type (e.g., where 00 indicates a stored/raw/literal section (for example, between 0 and 65,535 bytes in length), where 01 indicates a static Huffman compressed block (e.g., using a pre-agreed Huffman tree), 10 indicates a compressed block complete with the Huffman table supplied, and 11 may be reserved for future use), and a payload field that includes the symbols for the payload and ends with an end of block (EOB) indication, such as an EOB symbol (e.g., where an EOB value of 256 indicates an EOB).

In one embodiment, the alphabet for code lengths is (0-15) represents code lengths of 0-15, respectively, 16 indicates to copy the previous code length 3-6 times where 17 indicates to repeat a code length of 0 for 3-10 times (3 bits of length) and 18 indicates to repeat a code length of 0 for 11-138 times (7 bits of length).

Depicted dynamic compressed data stream 1514 includes a block final field (B FINAL) (e.g., as a single bit) to indicate if the block is the last block in the stream (e.g., 1 to indicate that block of data is the last block in the data stream and 0 to indicate there are more blocks to process in the data stream), a block encoding field (e.g., as two bits) to indicate the encoding method used for this block type (e.g., where 00 indicates a stored/raw/literal section (for example, between 0 and 65,535 bytes in length), where 01 indicates a static Huffman compressed block (e.g., using a pre-agreed Huffman tree), 10 indicates a compressed block complete with the Huffman table supplied, and 11 may be reserved for future use), a HCLEN field (e.g., as four bits) to indicate the number of code length codes minus four, an HLIT field (e.g., as five bits) to indicate the number of literal and length codes minus 257, an HDIST field (e.g., as five bits) to indicate the number of distance codes minus one, the (HCLEN+4)×3 bits field to indicate the code lengths for the code length alphabet discussed above, the (HLIT+257) x code lengths for the literal/length values encoded using the code length Huffman code, the (HDIST+1) code lengths for the distance values encoded using the code length Huffman code, and a payload field that includes the Huffman codes for the payload and ends with an end of block (EOB) indication, such as an EOB code.

FIG. 15 illustrates the format for three possible types of blocks (310, 312, 314) that may make up a Deflate compressed stream. In one embodiment, not compressed block 1510 is skipped to process the next block because its header contains information about its exact length. In one embodiment, compressed block (1512 and 1514) is fully decoded to locate its EOB symbol, e.g., before the next block can be processed. In certain embodiments, each symbol within a compressed block may vary in length from 1b-15b, and some symbols may utilize an additional number of bits from the payload during decode. In one embodiment, when a symbol is not decoded in the table (e.g., LUT) circuit (e.g., fast-path), for example, Literal and Length (LL) LUT circuit 322 or Distance (D) LUT circuit 1526, the serial decoding (e.g., ALU) circuit (e.g., slow-path), for example, LL ALU circuit 1520 or D ALU circuit 1524, is to complete the decode process by serially evaluating the payload against all possible code lengths. Following a successful decode operation, the literal, length, or distance symbol generated is used to reconstruct the raw stream, for example, in a (e.g., 32 KB) buffer. In one embodiment, a multiplexer (mux), for example, any or all of the three muxes in FIG. 15, is to select the first arriving input as its output.

FIG. 15 further illustrates the (e.g., encoded, compressed) data stream 308 with certain fields thereof being input into decompression accelerator pipeline 1500. Decompression accelerator pipeline 1500 includes a dual circuits (e.g., dual path, with one being a slower path and another being a faster (than the slower)) with each circuit to decode a (e.g., Deflate) code into a symbol, e.g., for further decompression into the original, uncompressed value. Depicted data stream 1508 is in the dynamic compressed format. In one embodiment, Deflate compression uses LZ77 algorithm along with the canonical Huffman prefix coding scheme to generate literals and length+distance pairs using references from a (e.g., 32 KB) history buffer. In certain embodiments, the literal/length and distance symbols are again Huffman encoded to achieve further compression. In one embodiment, information to decode the symbol code lengths are gathered from the payload header and stored in the (e.g., 19 entry) code length look-up table (CL LUT) 1518. In one embodiment, the Huffman code lengths from CL LUT are used to process the subsequent sections of the header to generate Huffman codes for the (e.g., 286) literal-length symbols and (e.g., 30) distance symbols. The literal-length and distance Huffman codes may be stored in LUTs (e.g., LL LUT 1522 and D LUT 1526, respectively) to avoid repetitive Huffman decode during the decompression process. In certain embodiments, all Huffman codes (e.g., a mapping of a Huffman code to the decoded symbol) are not stored in a LUT, e.g., because of the exponential dependency on code length (e.g., the length of each code), for example, handling all literal/length and distance codes (1b-15b) in a LUT may require at least 128 KB of storage. Furthermore, in certain embodiments, increasing LUT size may also increases access latency, e.g., thereby slowing down the look-up table circuit (e.g., fast-path). For example, a five bit length of code 10001 may be assigned to the symbol value "literal 0" (e.g., 0000 0000 in binary), and a second (e.g., fast-path) circuit (e.g., with a look-up table) may have 512 entries (e.g., for handling up to 9 bit length codes) such that all 16 entries corresponding to address 10000xxxx are to be filled with 0000 0000 (e.g., with a valid flag enabled for all those rows). In one embodiment, a set valid flag read from the second (e.g., fast-path) circuit (e.g., look-up table) indicates a successful decode. In certain embodiments of a table, all valid flags are initially set to zero and a valid flag is set to one when the entry (for example, a row, e.g., in the table in FIG. 9 or 10) is populated.

In one embodiment, a serial decoding circuit (e.g., ALU) (e.g., slow-path) may be selectively used for codes longer than a maximum bit length (e.g., for codes that are rarely encountered), for example, in conjunction with the look-up table circuit (e.g., LUT) (e.g., fast-path), for example, for more frequent shorter codes. In one embodiment, a circuit is to populate a (e.g., each) table with the values that map a code to a symbol, for example, as shown in FIGS. 9-11. In one embodiment, the circuit is to populate the table(s) with an intermediate value (e.g., intermediate symbol) representing the symbol and that intermediate value (e.g., intermediate symbol) may be converted to a symbol by a circuit, for example, the circuits in FIGS. 7 and 8.

Decoding symbols from codes in the input stream to generate literal and length+distance symbols may be a performance critical loop in Deflate decompression. In certain embodiments, the sum of code length and the extra number of bits that are picked from the payload is the actual number of bits that are consumed in any particular decode cycle. The payload in one embodiment is then shifted by the number of bits consumed to generate the next code (e.g., set of 15 bits) for evaluation, and the (e.g., fast-path) look-up process may be repeated until the end-of-block (EOB) symbol is decoded. A new header (e.g., B FINAL and B TYPE) may be processed after EOB and (e.g., all) LUTs may be repopulated before decoding the next block of compressed data.

Symbol output from decompression accelerator pipeline 1500 may be the (e.g., final) symbol or an intermediate value (e.g., intermediate symbol), for example, according to a format in FIGS. 9-11. In one embodiment, an intermediate value (e.g., intermediate symbol) is converted to a symbol by a circuit, for example, the circuit in FIG. 7 or FIG. 8.

Figure 16A:
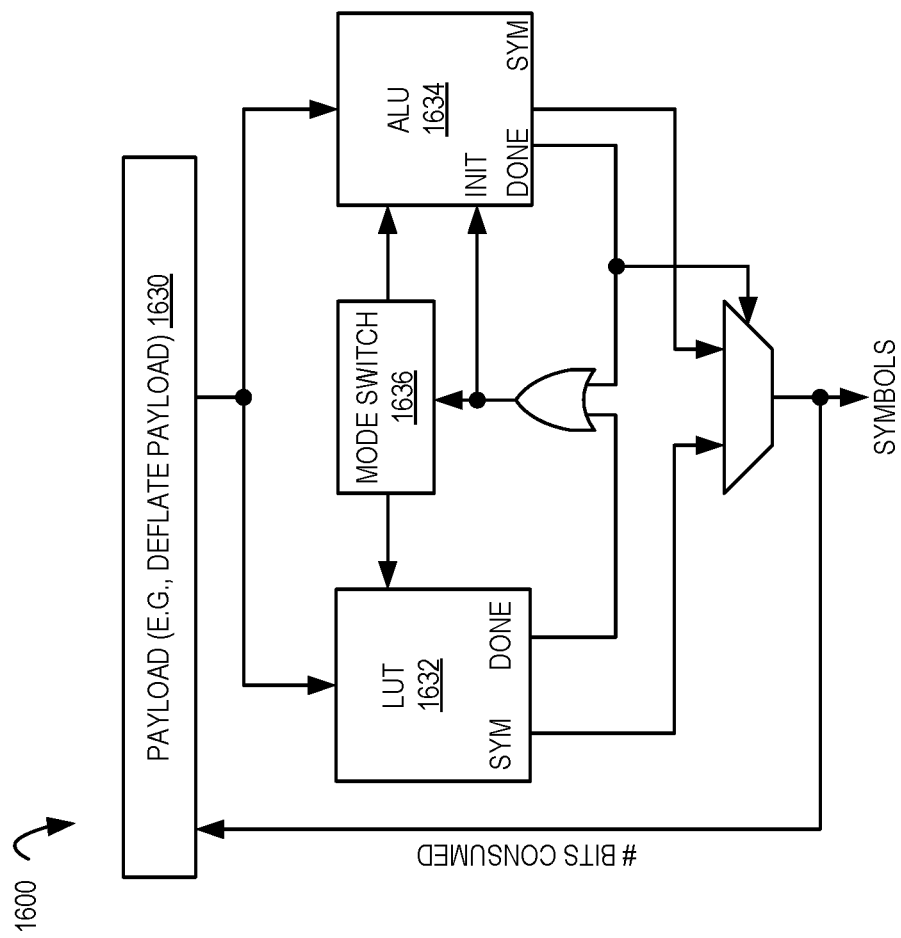
FIG. 16A illustrates a dual path decoder circuit according to embodiments of the disclosure.

FIG. 16A illustrates a dual path decoder circuit 1600 according to embodiments of the disclosure. A hardware accelerator may include circuit 1600. Circuit 1600 includes a first (e.g., slow-path) circuit (e.g., with an ALU 1634) to input a (e.g., Huffman encoded) code and serially decode the symbol from the code (e.g., serially comparing the code to all of the possible codes to determine the symbol). Circuit 1600 includes a second (e.g., fast-path) circuit (e.g., with a look-up table 1632) to input a (e.g., Huffman encoded) code and output a symbol (e.g., if the table includes an entry mapping the code to its decoded symbol). In one embodiment, circuit 1600 processes symbols equal to or less than a selected, maximum bit size (e.g., less than the total bit size possible for a symbol) in the second (e.g., fast-path) circuit (e.g., with a look-up table 1632), for example, and processes symbols greater than the selected, maximum bit size in the first (e.g., slow-path) circuit (e.g., with an ALU 1634). In one embodiment, all symbols who have a total length of 1b to 9b are processed in the second (e.g., fast-path) circuit (e.g., with a look-up table 1632), e.g., and the remaining symbols are processed in the first (e.g., slow-path) circuit (e.g., with an ALU 1634). In one embodiment, the LUT is implemented in static random access memory (SRAM). In certain embodiments, each type of code (e.g., of a literal code, length code, and distance code) includes its own dual path circuit (e.g., circuit 1600). In certain embodiments, a literal code and length code share a same dual path circuit (e.g., circuit 1600) and a distance code includes its own dual path circuit (e.g., circuit 1600), for example, as depicted in FIG. 3 with an ALU circuit 320. In one embodiment, mode switch 1636 of circuit 1600 is to switch between a mode for each type of code (e.g., a literal code, length code, and distance code), for example, on detection of that type of code. In one embodiment, mode switch 1636 of circuit 1600 is to switch between a first mode for a literal or length type of code and a second mode for a distance type of code), for example, on detection of that type of code. In one embodiment, an OR gate (e.g., in FIGS. 16A and 16B) indicates the cycle when an input is successfully decoded. For example, for a code having a bit length that is less than a given bit length (e.g., less than 10b), the second (e.g., fast-path) circuit (e.g., with a look-up table 1632) may get a hit (e.g., by reading a valid flag) in the same cycle, and the MUX may select the result from the second (e.g., fast-path) circuit (e.g., with a look-up table 1632). In one embodiment, if the second (e.g., fast-path) circuit (e.g., with a look-up table 1632) misses (e.g., the symbol for the code is not in the table), then (e.g., a few cycles later) the first (e.g., slow-path) circuit (e.g., with an ALU 1634) may detect that and then indicate decode completion, and in such a scenario, the MUX selects the results from the second (e.g., fast-path) circuit (e.g., with a look-up table 1632).

In one embodiment, the payload 1630 (e.g., Deflate payload) is processed simultaneously in the first (e.g., slow-path) circuit (e.g., with an ALU 1634) and the second (e.g., fast-path) circuit (e.g., with a look-up table 1632) and the correct decoded symbol (e.g., and bit shift magnitude) is selected from the circuit (e.g., path) that completes first. In one embodiment, e.g., with the flexible code length evaluation scheme discussed herein, the first (e.g., slow-path) circuit (e.g., with an ALU 1634) may complete before the second (e.g., fast-path) circuit (e.g., with a look-up table 1632). In certain embodiments, following a successful decode operation of code to symbol, a code length stepping circuit (e.g., state machine) may be initialized and the Deflate payload is advanced to process the next symbol. In one embodiment, both circuits (e.g., fast and slow paths) operate on a code concurrently (e.g., simultaneously) for example, for increased throughput. In one embodiment, the first (e.g., slow-path) circuit (e.g., with an ALU 1634) is operated only after the second (e.g., fast-path) circuit (e.g., with a look-up table 1632) reports a miss (e.g., the code is not in the table), for example, to avoid a wasteful slow path decode and improve energy efficiency. In one embodiment, a LUT takes an input of a code and then outputs the decoded symbol for that code (e.g., according to a Huffman encoding), for example, if there is an entry for the mapping of the code to symbol.

Figure 16B:
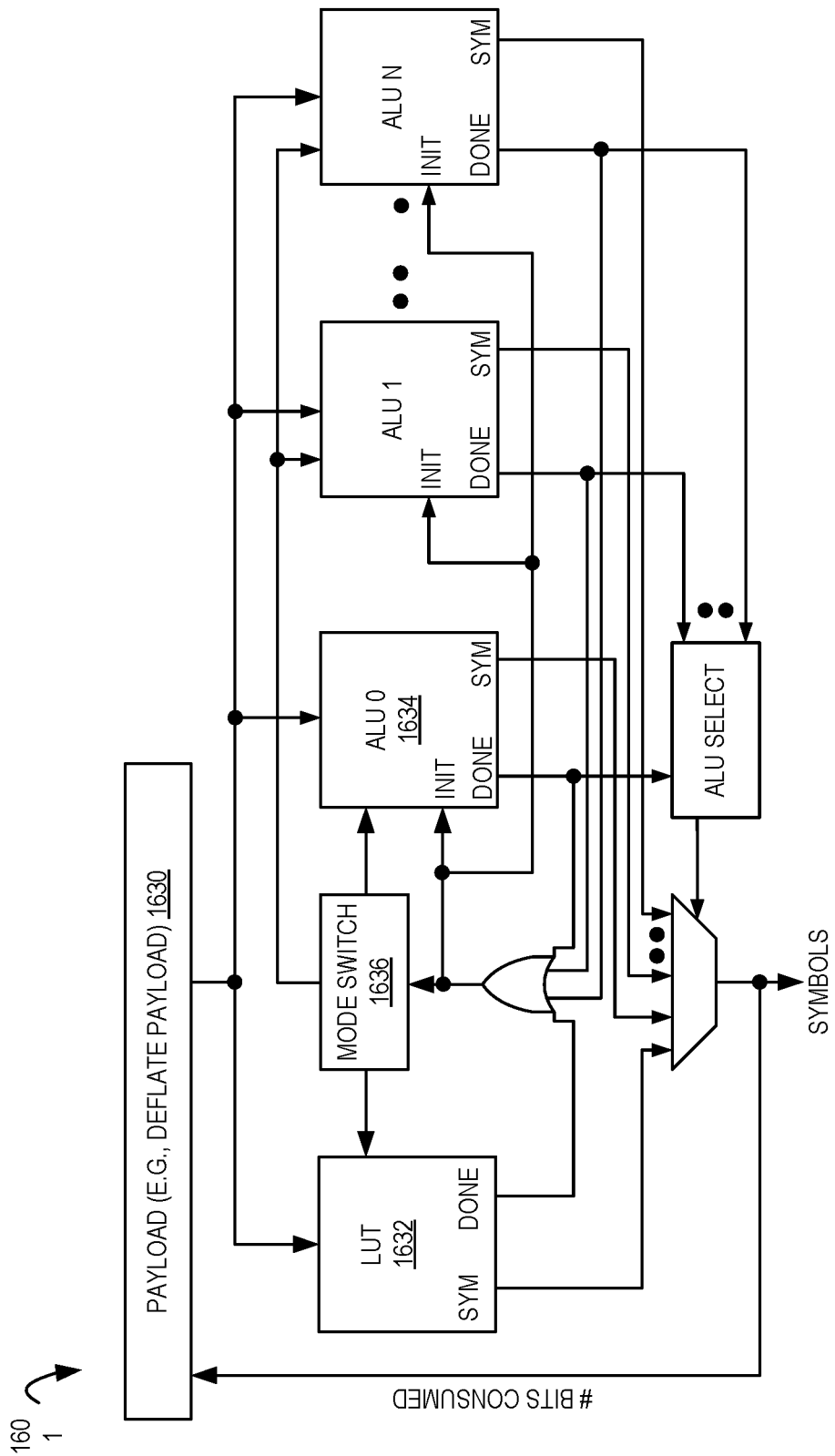
FIG. 16B illustrates a multiple path decoder circuit according to embodiments of the disclosure.

FIG. 16B illustrates a multiple path decoder circuit 1601 according to embodiments of the disclosure. In comparison to FIG. 16A, the circuit 1601 in FIG. 16B includes multiple (e.g., 2 or more) of the first (e.g., slow-path) types of circuit (e.g., each with an ALU). In one embodiment, each ALU is to serially decode codes with a bit length of a set of bit lengths (for example, bit lengths of a range (e.g., 10-12 bit lengths or 13-15 bit lengths) or certain (e.g., non-contiguous) bit lengths. In one embodiment, a first of the first type of circuit (e.g., ALU 0) is to serially decode codes with a bit length of a first set of bit lengths (e.g., in the 10-12 bit length range) and a second of the first type of circuit (e.g., ALU 1 or N) is to serially decode codes with a bit length of a second, different set of bit lengths (e.g., in the 13-15 bit length range).

In one embodiment, an accelerator may include one or more first (e.g., slow-path) types of circuit (e.g., each with an ALU) and/or one or more the second (e.g., fast-path) types of circuits (e.g., each with a look-up table). A code may be provided to a decoder circuit (e.g., circuit 1600 or circuit 1601) and the first of the circuits (e.g., paths) to decode the code into a symbol (or an intermediate value of a symbol) may output that symbol (or intermediate value of the symbol). In one embodiment, a decode circuit may have an ALU for each different mode.

Symbol output from circuit 1600 and circuit 1601 may be the (e.g., final) symbol or an intermediate value (e.g., intermediate symbol), for example, according to a format in FIGS. 9-11. In one embodiment, an intermediate value (e.g., intermediate symbol) is converted to a symbol by a circuit, for example, the circuit in FIG. 7 or FIG. 8.

Figure 17:
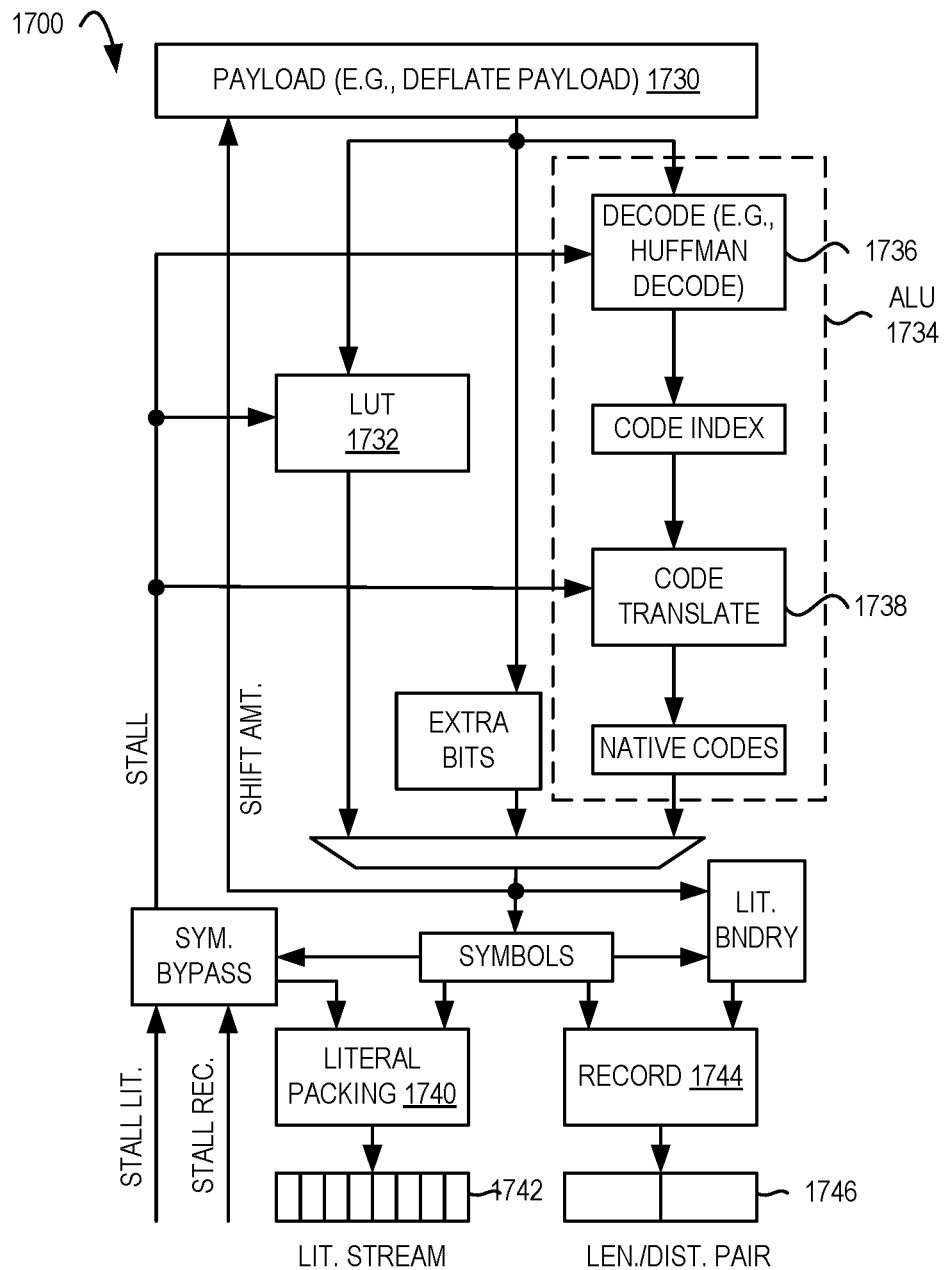
FIG. 17 illustrates a hardware decompression accelerator with a dual path decoder circuit according to embodiments of the disclosure.

FIG. 17 illustrates a hardware decompression accelerator 1700 with a dual path decoder circuit according to embodiments of the disclosure. Depicted dual path decoder circuit includes a first (e.g., slow-path) circuit (e.g., with an ALU 1734) and the second (e.g., fast-path) circuit (e.g., with a look-up table 1732) to selectively decode payload 1730. In one embodiment, the second (e.g., fast-path) circuit (e.g., with a look-up table 1732) has a single (e.g., clock) cycle latency (e.g., a single cycle between an input being provided and generating an output). In one embodiment, the first (e.g., slow-path) circuit (e.g., with an ALU 1734) has a greater cycle latency that the second (e.g., fast-path) circuit (e.g., with a look-up table 1732). In one embodiment, the first (e.g., slow-path) circuit (e.g., with an ALU 1734) has a latency of 3 or more clock cycles, e.g., from 3 to 17 clock cycles. In the depicted embodiment, e.g., maximize operating frequency, the first (e.g., slow-path) circuit (e.g., with an ALU 1734) is internally pipelined twice by partitioning the circuit into the decode portion 1736 (e.g., Huffman decode portion) and code translation portion 1738. In one embodiment, the decode portion 1736 of the circuit is to compute the raw variable length Huffman code index from the payload, and then the code translation portion 1738 of the circuit is to generates the actual literal value, base, and number of extra bits from the raw index, e.g., according to the Deflate algorithm. For example, the extra bits may be concurrently picked from the payload and concatenated with the base to generate the biased lengths and offsets for length and distance codes, respectively. In the subsequent clock cycle, the biased lengths and offsets may be incremented by 3 and 1, respectively, to generate the actual lengths and offsets. This embodiment may simplify the underlying hardware by making it possible to generate the unbiased lengths/offsets with simple shift operations without any arithmetic (e.g., ALU) circuit operations. For example, certain addition operations may be simplified because of one operand being fixed constants (e.g., 3 and 1), but critical path latency may be further reduced by postponing these operations, for example, to a non-timing-critical third cycle (e.g., which originally only included the simple extra-bit concatenation operation).

Depicted hardware decompression accelerator 1700 includes a literal packing circuit 1740 and a record circuit 1744. In one embodiment, literal symbols output from the first (e.g., slow-path) circuit (e.g., with an ALU 1734) and the second (e.g., fast-path) circuit (e.g., with a look-up table 1732) are directed (e.g., by their format) to the literal packing circuit 1740. In one embodiment, the literal packing circuit 1740 is to pack literal symbols into a vector (e.g., vector register 1742), for example, which each element of the vector being a literal symbol. In one embodiment, this literal stream is sent (for example, to a processor or processor core) when it has reached a certain level of fullness (e.g., totally full). In one embodiment, length symbols and distance symbols output from the first (e.g., slow-path) circuit (e.g., with an ALU 1734) and the second (e.g., fast-path) circuit (e.g., with a look-up table 1732) are directed (e.g., by their format) to the record circuit 1744. In one embodiment, record circuit 1744 may receive (e.g., sequentially) a length symbol and distance symbol pair (e.g., individually and combine them into a correct pair). In one embodiment, the length and distance symbol pairs are loaded into a vector (e.g., vector register 1746). In one embodiment, one or more pairs of length and distance symbols may be transmitted to the processor or processor core.

Symbol in and/or output from hardware decompression accelerator 1700 may be the (e.g., final) symbol or an intermediate value (e.g., intermediate symbol), for example, according to a format in FIGS. 9-11. In one embodiment, an intermediate value (e.g., intermediate symbol) is converted to a symbol by a circuit, for example, the circuit in FIG. 7 or FIG. 8.

Figure 18:
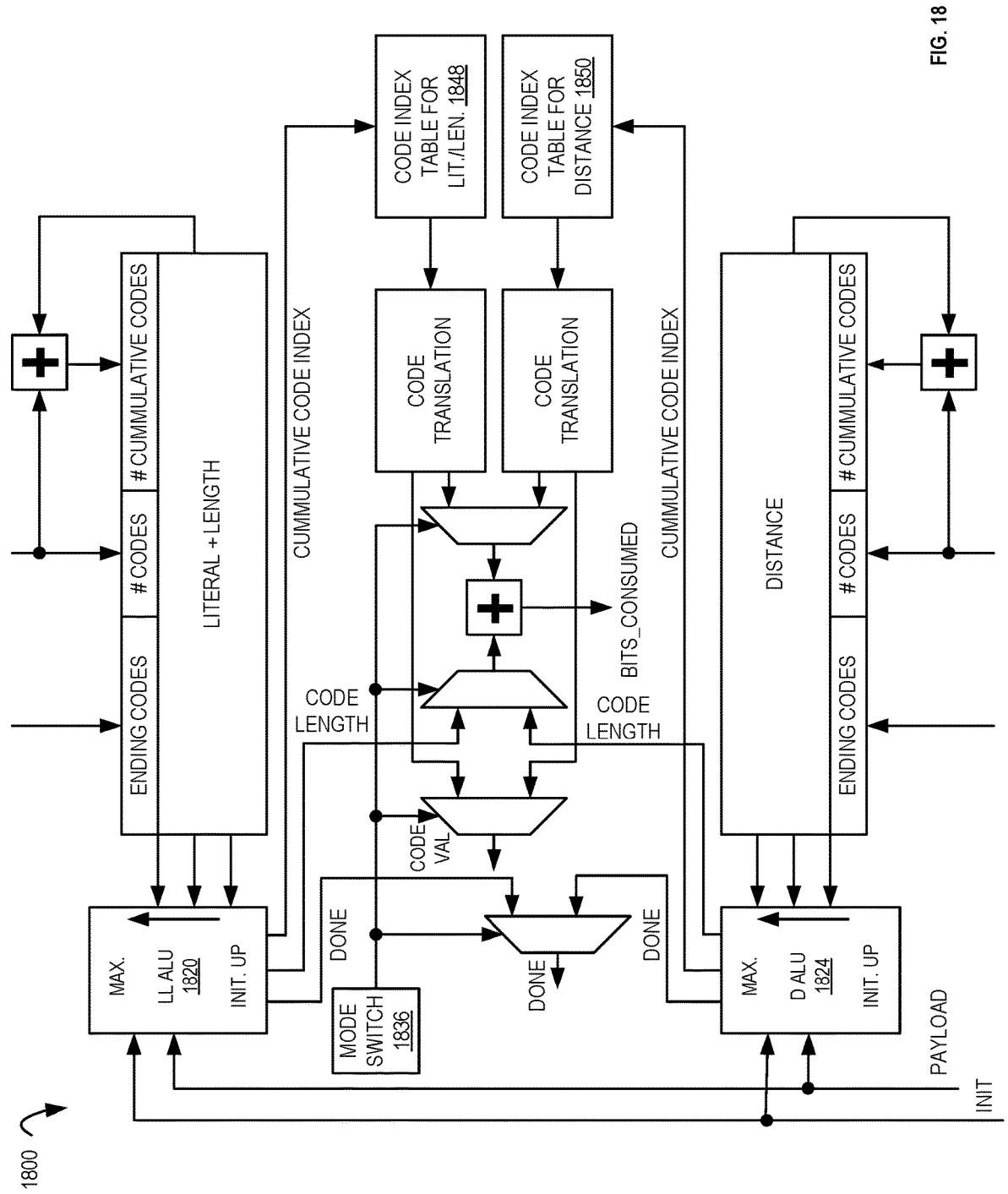
FIG. 18 illustrates a circuit to serially decode a code into a symbol according to embodiments of the disclosure.

FIG. 18 illustrates a (e.g., ALU) circuit 1800 to serially decode a code into a symbol according to embodiments of the disclosure. Circuit 1800 may be utilized as the first (e.g., slow-path) circuit of the embodiments discussed herein. In one embodiment, a serially decoding circuit (e.g., to decode a Huffman encoded code to a symbol), for example, an ALU, fetches the ending code and the number of codes for each code length from a (e.g., 15 entry) local LUT and computes the cumulative code index. The cumulative code index may be compared against the payload to determine if the payload matches a valid Huffman code. The cumulative code index computation step in certain embodiments makes this approach serial and limits the first (e.g., slow-path) circuit performance. In the depicted embodiment in FIG. 18, cumulative indices for (e.g., all) code lengths are pre-computed (e.g., while parsing the block header) and stored in this first (e.g., slow-path) circuit LUTs (e.g., Literal and Length Code Index Table 1848 and Distance Code Index Table 1850). In certain embodiments, this allows payload evaluation against any arbitrary code-length, for example, to provide improvement in decode throughput and/or may also expose the first circuit (e.g., slow path) decode process to parallelization by eliminating the serial step. For example, throughput may be improved in certain embodiments by instantiating multiple slow path decoders. In one embodiment, mode switch 1836 of circuit 1800 is to switch between a first mode for a literal or length type of code and a second mode for a distance type of code), for example, on detection of that type of code. In one embodiment, an ALU (e.g., ALU circuit) includes an (e.g., up) counter to progressively evaluate bit lengths of codes, for example, from an initial (e.g., given) value (e.g., 10 bits) to the maximum value (e.g., 15 bits). In one embodiment, an ALU (e.g., Distance D ALU 1820 or Literal and Length LL ALU 1824) only evaluates code lengths greater than a given (e.g., pre-selected) bit length (e.g., code length), for example, where those code lengths less than or equal to the given bit length are decoded in LUT having entries therefor. In one embodiment, the given length is different for each of a D ALU and an LL ALU. In another embodiment, an ALU (e.g., ALU circuit) includes a state-machine (e.g., replacing the counter) to direct the circuit to evaluate code lengths (e.g., in a non-contiguous order, such as, but not limited to, 14, 12, 10, 13, 15). Circuit 1800 may output a symbol, e.g., and not an intermediate value (e.g., intermediate symbol).

Figure 21:
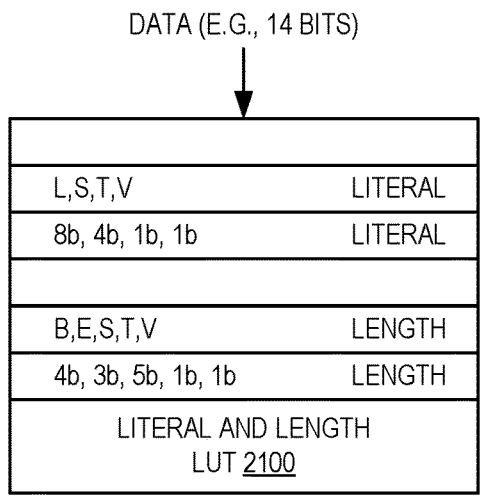
FIG. 21 illustrates entry formats for a table of mappings of a literal symbol for a literal code and a length symbol for a length code according to embodiments of the disclosure.
Figure 22:
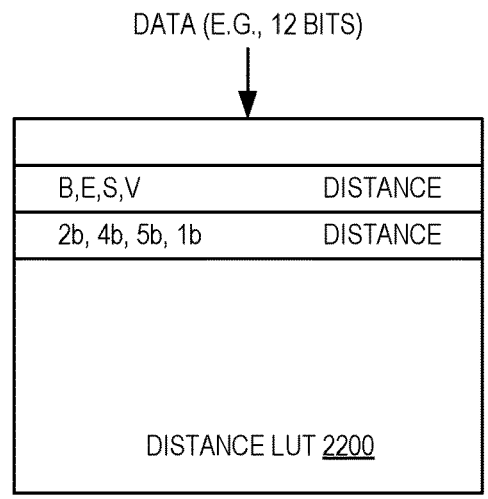
FIG. 22 illustrates an entry format for a table of mappings of a distance symbol for a distance code according to embodiments of the disclosure.
Figure 23:
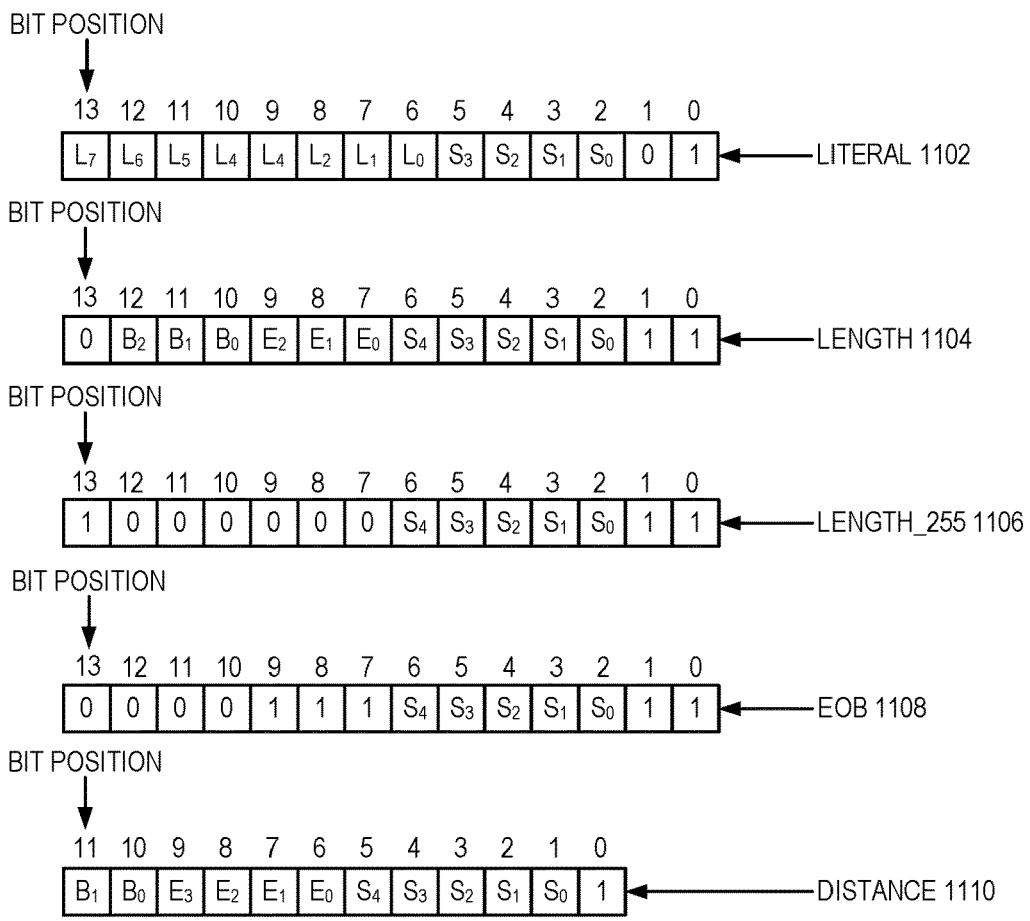
FIG. 23 illustrates entry formats for a table of an end of block (EOB) indication and for mappings of a literal symbol for a literal code, a length symbol for a length code, a length symbol for a 255 bit length code, and a distance symbol for a distance code according to embodiments of the disclosure.

FIG. 19 illustrates a circuit 1900 to determine from a table a literal symbol for a literal code and a length symbol for a length code according to embodiments of the disclosure. FIG. 20 illustrates a circuit 2000 to determine from a table a distance symbol for a distance code according to embodiments of the disclosure. FIG. 21 illustrates entry formats for a table 2100 of mappings of a literal symbol for a literal code and a length symbol for a length code according to embodiments of the disclosure. FIG. 22 illustrates an entry format for a table 2200 of mappings of a distance symbol for a distance code according to embodiments of the disclosure. FIG. 23 illustrates entry (e.g., intermediate) formats for a table of an end of block (EOB) indication 2308 and for mappings of a literal symbol for a literal code 2302, a length symbol for a length code 2304, a length symbol for a 255 bit length code 2306, a distance symbol for a distance code 2310 according to embodiments of the disclosure.

In certain embodiments, a LUT (e.g., LUT 2100 for lengths and literals and LUT 2200 for distance) may include one or more entries mapping a (e.g., Huffman encoded) code to a symbol. In one embodiment, the code maps to a linear address of the corresponding entry in the table for that code. In one embodiment, entries in a table are populated before use of the table, for example, populated from the data in a header of an encoded, compressed data stream (e.g., a Deflate data stream). In one embodiment, the entries in LUT 2100 for lengths and literals are each 14 bits in length for example, according to the formats in FIG. 23. In one embodiment, the entries in the LUT 2200 for distance are each 12 bits in length, for example, according to the distance format 2310 in FIG. 23. These are example formats and other numbers of bits may be utilized in other embodiments.

In reference to FIGS. 21 and 23, entries for a mapping of a code to a symbol include one or more of: literal values for literal symbols stored in the 8 bit format of $\{L_7, L_6, L_5, L_4, L_3, L_2, L_1, L_0\}$, and base and extra-bits for length/distance symbols stored in the three bit format of $\{B_2, B_1, B_0\}$ and $\{E_2, E_1, E_0\}$ respectively. In certain embodiments, additionally or alternatively, entries for a mapping of a code to a symbol may include (e.g., pre-computed) shift magnitudes $\{S_4, S_3, S_2, S_1, S_0\}$ for each entry, for example, in contrast to a format that stores the code lengths for each entry.

EOB may have format 1108, e.g., such that the seven most significant bits, indicated that it is an EOB and not one of the other types (e.g., formats) of data.

Referring again to FIGS. 19 and 20, a second (e.g., fast-path) circuit (e.g., with look-up tables 2100 and 2200) may receive a code to decode into a symbol. The second (e.g., fast-path) circuit may determine the type of code, for example, to send a decode request for a length or literal code to a Length and Literal LUT (e.g., LUT 2100) and to send a decode request for a distance code to Distance LUT (e.g., LUT 2200). Respective LUT may then provide an output symbol (e.g., in an intermediate format "C" (e.g., intermediate symbol "C")) according to the formats in FIG. 23) to the circuit 1900 and/or circuit 2000, which circuit(s) then may output the (e.g., final) symbol therefrom.

In one embodiment, intermediate format of data for an input code, e.g., intermediate format for a literal code (e.g., in format 2302), intermediate format for a length code (e.g., in format 2304 or 2306), intermediate format for an EOB code (e.g., in format 2308) is input into circuit 1900 and the respective bits cause an output of one or more of: bit shift magnitude (shift), the symbol value (symbol_val) for the code, and the code type (code_type), e.g., a length, 255 length, literal, or EOB.

In one embodiment, intermediate format of data for an input code, e.g., intermediate format for a distance code (e.g., in format 2310) is input into circuit 1900 and the respective bits cause an output of one or more of: base, extra bits, and bit shift magnitude (shift).

In one embodiment, a mode switch (e.g., mode switch 1636 in FIGS. 16A and 16B) may be utilized to switch between a first mode for a literal or length type of code to output from circuit 1900 and a second mode for a distance type of code), for example, on detection of that type of code to output from circuit 2000. In certain embodiments, low latency is accomplished by optimally pre-computing the information in an intermediate format (e.g., not in the same format of the code or the symbol) in the LUT. In certain embodiments, a circuit (e.g., circuit 1900 and circuit 2000) may consume the intermediate format data for a mapping of a code to a symbol to thus output the symbol, e.g., with minimal subsequent processing. In certain embodiments, the intermediate format for an encoded code and its decoded symbol for literal/length and distance entries allows minimal post-processing following the LUT read access, e.g., to maximize the second (e.g., fast-path) circuit operating frequency. For example, as shown in FIGS. 19 and 20, the "shift", "symbol_val" and "extra_bits" fields may be generated from the LUT entry after a maximum of two logic gates. In one embodiment, other signals, e.g., like "code_type", do not impact the second (e.g., fast-path) circuit critical path, and hence may be derived from logic with deeper depth without impacting the second (e.g., fast-path) circuit critical path.

Figure 25:
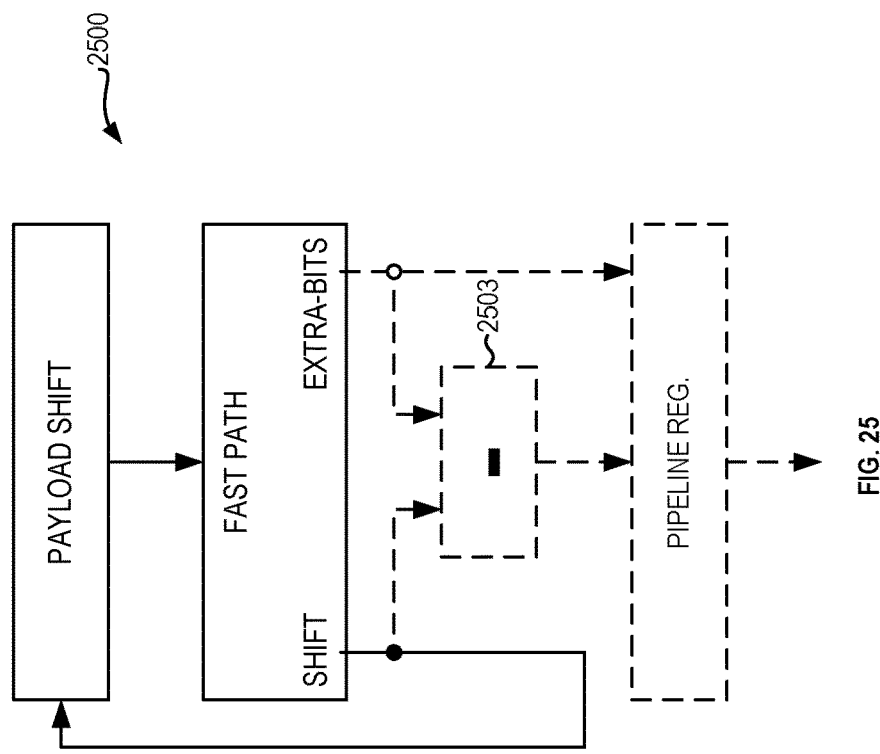
FIG. 25 illustrates a circuit to obtain the next code from a bit shift magnitude field in a table entry according to embodiments of the disclosure.
Figure 24:
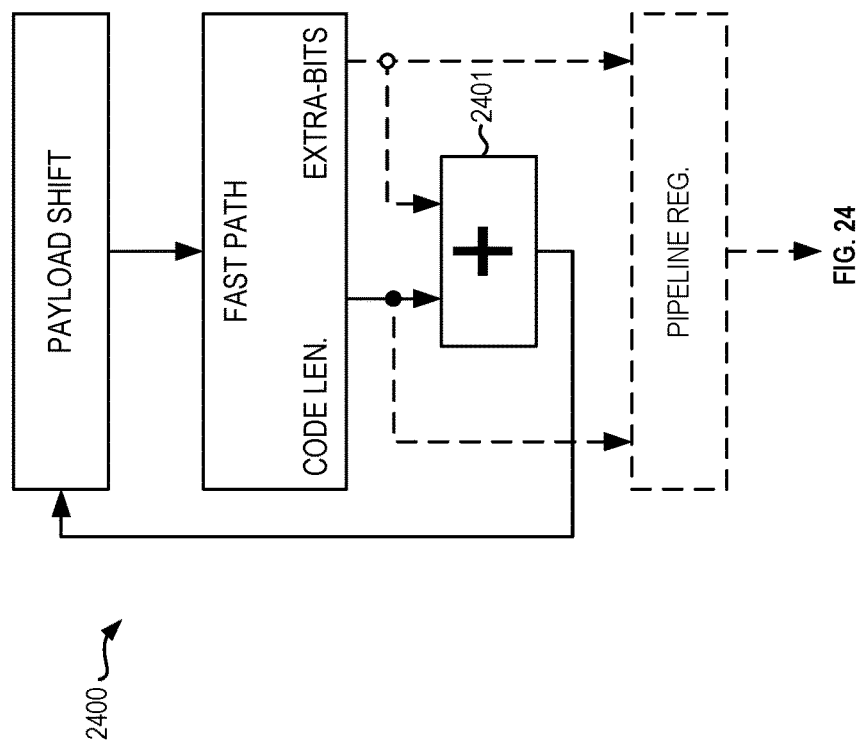
FIG. 24 illustrates a circuit to obtain the next code from a code length according to embodiments of the disclosure.

FIG. 24 illustrates a circuit 2400 to obtain the next code from a code length according to embodiments of the disclosure. FIG. 25 illustrates a circuit 2500 to obtain the next code from a bit shift magnitude field in a table entry according to embodiments of the disclosure. In the depicted embodiment in FIG. 24, the bit shift magnitude for obtaining the next code is determined by using adder 2401 to add the code length value and the extra bits value. In contrast, in the depicted embodiment in FIG. 25, the bit shift magnitude for obtaining the next code is determined by using the bit shift magnitude (e.g., without performing an addition or other calculations) from the table entry (e.g., that was previously determined during the population of the table). In one embodiment, the subtractor 2503 may be included to determine the code length by subtracting the extra bits value from the bit shift magnitude.

Figure 26:
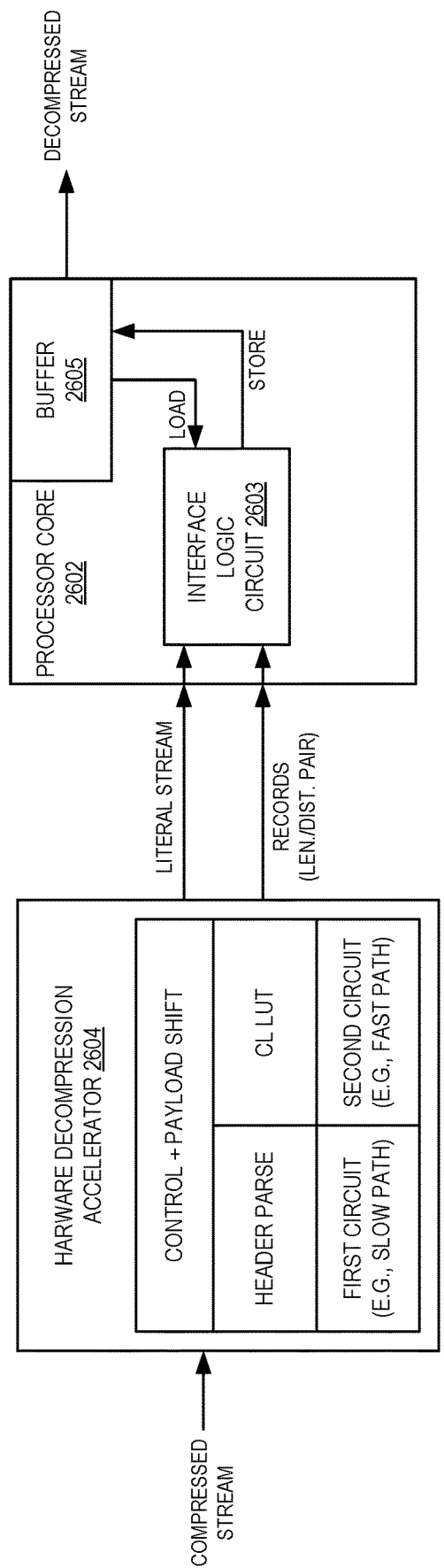
FIG. 26 illustrates a hardware processor core and a hardware decompression accelerator according to embodiments of the disclosure.

FIG. 26 illustrates a hardware processor core 2602 and a hardware decompression accelerator 2604 according to embodiments of the disclosure. In certain embodiments, the hardware decompression accelerator 2604 takes an input compressed stream and generates intermediate instructions in the form of literal (e.g., literal symbol) streams and length and distance pair records that are input into the hardware processor core 2602, e.g., through interface circuit 2603. In one embodiment, the interface circuit translates the literal streams and records into load and store instructions that operate on the buffer 2605 (e.g., that includes previously decompressed portions of the data), and thus subsequently reconstruct the decompressed stream. In certain embodiments, a buffer may be sized according to the compression algorithm being decompressed. In one embodiment, hardware decompression accelerator 2604 includes one or more of the components of hardware decompression accelerator 500 in FIG. 17).

Figure 27:
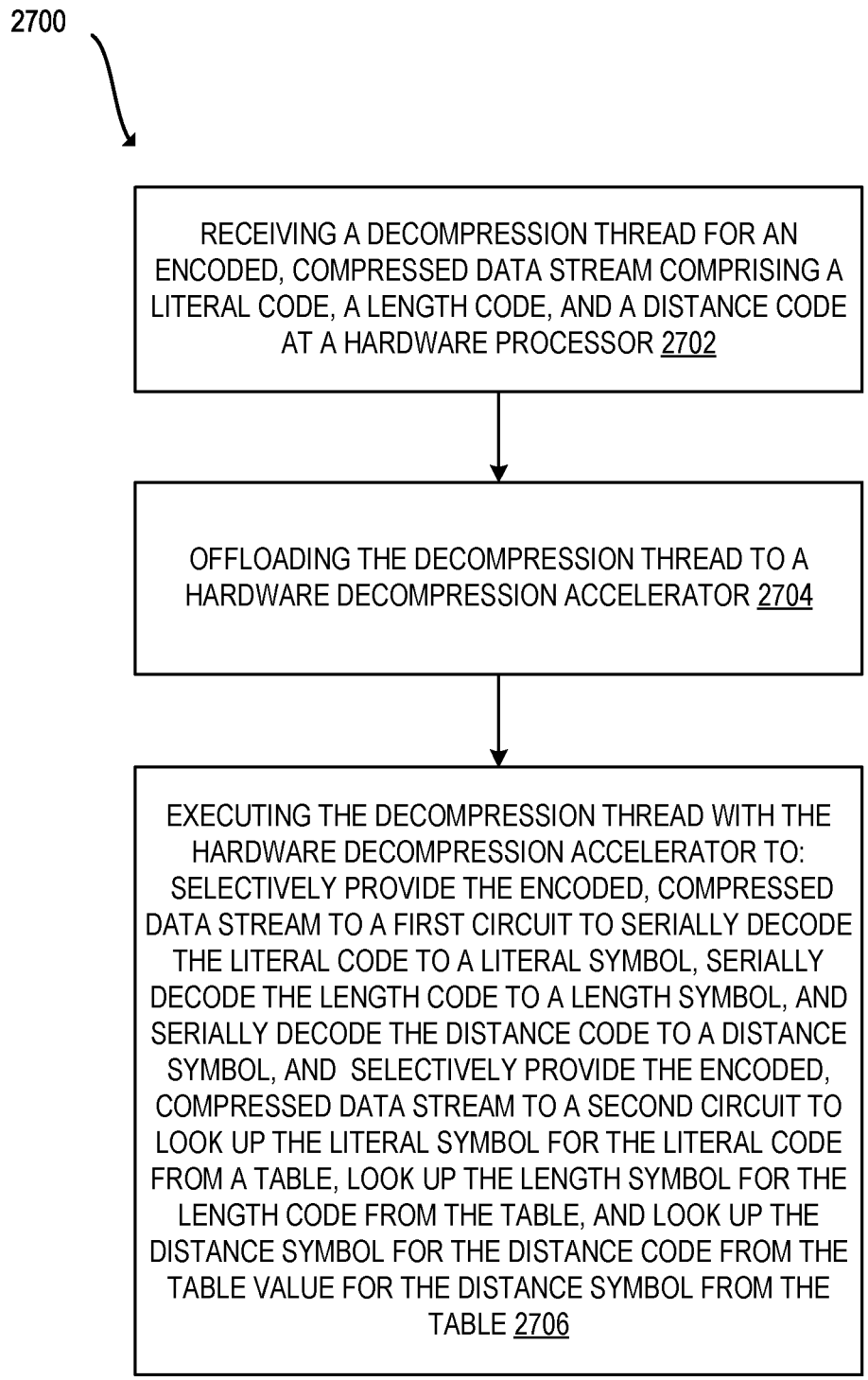
FIG. 27 illustrates a flow diagram according to embodiments of the disclosure.

FIG. 27 illustrates a flow diagram 2700 according to embodiments of the disclosure. Flow diagram 2700 includes receiving a decompression thread for an encoded, compressed data stream comprising a literal code, a length code, and a distance code at a hardware processor 2702, offloading the decompression thread to a hardware decompression accelerator 2704, and executing the decompression thread with the hardware decompression accelerator to: selectively provide the encoded, compressed data stream to a first circuit to serially decode the literal code to a literal symbol, serially decode the length code to a length symbol, and serially decode the distance code to a distance symbol, and selectively provide the encoded, compressed data stream to a second circuit to look up the literal symbol for the literal code from a table, look up the length symbol for the length code from the table, and look up the distance symbol for the distance code from the table, wherein each mapping of a code to a symbol entry in the table further comprises a bit shift magnitude field for the code to obtain a next code of the encoded, compressed data stream 2706.

Certain embodiments herein may be utilized in a client decompressing (e.g., hypertext transfer protocol (HTTP)) traffic from a server. Certain embodiments herein may be utilized in database, storage and networking applications to speed up decompression, for example, in web-traffic, index-servers, I/O assistance in compressed file systems, and in-memory databases. Certain embodiments herein allow a hardware accelerator (e.g., execution unit) to configure the hardware towards more calculations (e.g., slow-path) or more memory look-ups (e.g., fast-path). Certain embodiments herein provides hardware and methods to increase decompression throughput, for example, through a (e.g., fast-path) data format with pre-computed shift magnitude and/or arbitrary code length evaluation scheme (e.g., in the slow-path).

CAM-Based Header Parsing and ALU-Based Huffman Symbol Decode

An ALU-based approach towards decompressing the body of the Deflate block is described below in view of the above embodiments of the invention. The way that Deflate Huffman codes are defined, all of the codes of a given length have lexicographically consecutive values. There are a series of ALUs (one for each possible code length, or 15 in one implementation), where each one assumes that the next sequence of input bits will contain a token corresponding to the ALU's length. For example, a 4-bit ALU will "assume" that the next 4 input bits will contain a 4-bit token. The ALU can then compare the next N bits to the min and max code values of that length and determine whether or not the next N bits actually is an N-bit code. All of the ALUs can operate in parallel, so they can very quickly determine how many bits correspond to the next token, and hence where the following token starts. This is the critical path for the hardware and sets the fundamental limit on how fast decompression can proceed for symbol decode.

The non-critical path, however, requires the conversion of the input bits into a token value or symbol which is done using a Look Up Table (LUT). The token/symbol values for each size of Huffman code are grouped together in the LUT. This makes the calculation of the LUT index: (current_input−smallest_code_value+starting_LUT_index).

In the embodiments of the invention described below, the lookup table (LUT) is replaced with a content-addressable table which behaves, at least in some ways, like a content-addressable memory (CAM) structure. While these new tables are referred to as "CAMs" below for convenience, they are not merely the same structures of the original lookup tables implemented with special CAM circuits. Since this is not on the critical path of determining where the next Huffman code begins in the bit-stream, it is acceptable if a few pipelined cycles are required to complete the CAM lookup.

The CAM is carefully structured to reduce the compute required by the ALUs to determine the key. In one embodiment, the CAM can be written during the first header parser pass based on the length data, thus allowing the header parser to skip the second pass and complete processing significantly sooner.

In one embodiment, the data structure is also carefully designed to ensure that save/restore state space is minimized, causing minimal impact to the flows/performance where a decompression job is processed as a continuation of a previous job and the tables need to be loaded into the engine.

A CAM can be considered a list of key-value pairs. In one embodiment, the CAM contains only keys and the "value" is the index of the entry in the array (see, e.g., 2805 in FIG. 28B). In this implementation, the key consists of the length of the Huffman Code concatenated with an index of the instance which has that code length.

For example, assuming three codes of length 4 bits, the three entries in the CAM would contain keys (4, 0), (4, 1), and (4, 2). Each key would be written to a CAM location corresponding to the value associated with that code. For example, if the three 4-bit Huffman codes corresponded to tokens 10, 20, and 25, then these three keys would be written to CAM locations 10, 20, and 25 respectively.

Avoiding unnecessary details of parsing a Deflate header (which are well known in the art), the output of a first logic block is essentially a list of the lengths of the Huffman codes produced in token/symbol order. The code lengths are represented as literals or runs of lengths, and then Huffman encoded.

Figure 28B:
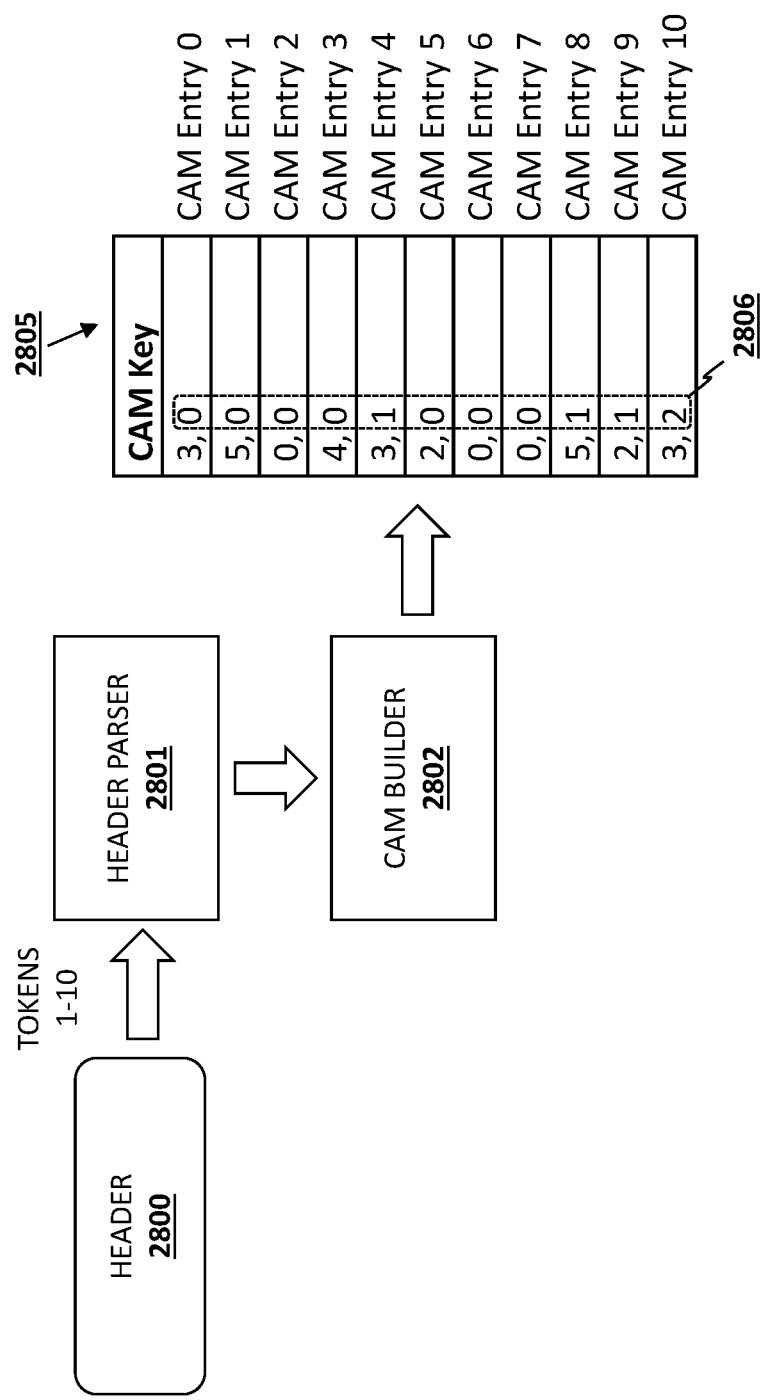
FIG. 28B illustrates one embodiment for generating a content addressable data structure including a value generated from code lengths and a number of prior instances of the code lengths.

FIGS. 28A-B illustrate an example in which a header parser 2801 parses a Deflate header 2800 to extract eleven tokens and associated length values. A CAM builder 2802 adds a new entry to a content-addressable data structure 2805 (e.g., a CAM) for each of the eleven tokens. In this example, the header parser 2801 generates the list of lengths (3, 5, 0, 4, 3, 2, etc), which the CAM builder 2802 uses to write each row. The corresponding Huffman code is provided in the third column in FIG. 28A, but at this point in the processing, these code values are not known. In one embodiment, the CAM builder 2802 includes/accesses counters and associated circuitry to count the number of tokens associated with the length prior to the current token. In one embodiment, a separate counter is maintained for each length and incremented in response to detecting a new token having that length. For each length that is generated, the CAM builder 2802 writes that length and the associated incremented count value to the CAM 2805.

In the example in FIGS. 28A-B, the first length (for token 0) is 3. So the hardware writes (3,0) to the first entry in the CAM 2805. Later on, when the length for token 4 is generated (which is also 3), it will write (3,1) to the CAM entry 4. Still later, when it generates the length for token 10, it writes (3,2) to CAM entry 10. The tokens that do not appear in the Huffman Table, i.e. those with a zero length (in the example, tokens 2, 6, and 7), cause (0,0) to be written to the CAM (or if the CAM is initialized to all 0's, these values are not written at all). It can be seen from the description above that the CAM values can be generated and written before all of the code lengths have been generated.

In current implementations which use a lookup table, the table index computed by the ALU is:
(current_input−smallest_code_value+starting_LUT_index).

In one embodiment, when working with the CAM 2805, the ALUs generate as output:
(ALU_size, current_input−smallest_code_value)

Thus, the index portion 2806 of the CAM key is the count of how many times codes of that length have appeared earlier the table. In one embodiment, limits are placed on how big the index value 2806 can be. The worst case occurs when all of the Huffman codes are the same length. In that case, the index portion 2806 of each CAM key 2805 is the same as the index of the CAM entry.

Consequently, for most of the CAM entries, it is not required to have nine (the maximum value based on the Deflate standard) flops to store the index portion 2806 of the key. The portions of the key without flops are implicitly 0. For example, the index portion 2806 of the key for CAM entry 0 doesn't need any bits, because its value is always 0. The index portion of the key for CAM entry 1 only needs one bit, because it can only take values 0 or 1; the index portion for CAM entry 2 only needs 2 bits, because it can only take values 0, 1, or 2, and so on. This reduces the number of flops needed for the CAM 2805 by 15%.

In order to handle a large decompress job that is submitted in multiple chunks, state of the decompressor, including the Huffman tables, needs to be saved and restored. It is assumed in the below example that the LUT requires 265*8=2120 bits of storage. Note, however, the underlying principles of the invention are not limited to this implementation.

The CAM 2805 can be stored and represented in the state structure in different ways. In one embodiment, each entry is written in the same format, requiring 265*13=3445 bits, assuming 4 bits for the length and 9 bits for the index (4+9=13). The stored format of 3445 bits is larger than the 2120 bits required for the LUT, thereby increasing the time required for saving and restoring.

Figure 29:
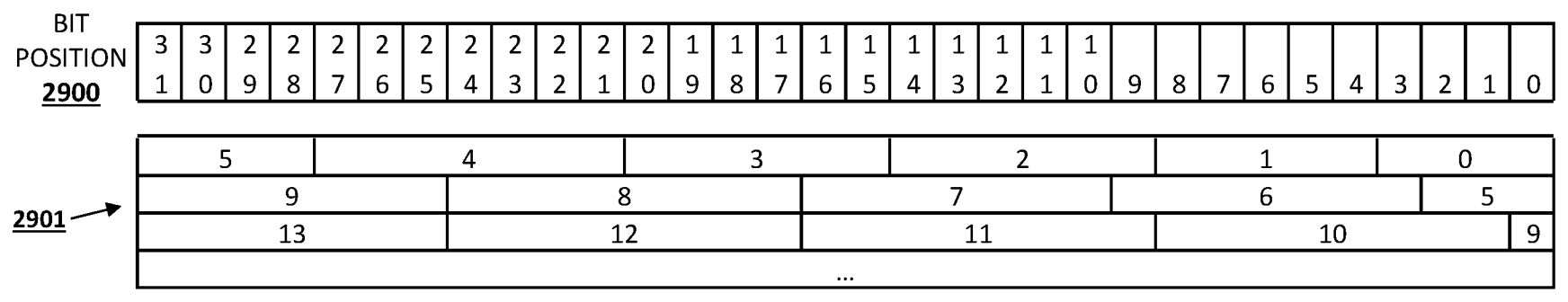

In one embodiment, the optimization described above is used to write only the non-trivial bits, making the format more irregular, but saving significant storage space. In one implementation illustrated in FIG. 29, the first plurality of doublewords 2901 of this format are arranged using the reduced bit allocations for the index. The bit position 2900 associated with each doubleword is indicated and the number in the corresponding doubleword 2901 represents the CAM entry which is written into that location. For example, CAM entry 0 (for which no index is required) consumes 4 bits, CAM entry 1 consumes 5 bits, CAM entry 2 consumes 6 bits, and so on, reducing the total size to 2934 bits.

For the smallest size, one could just write the lengths. This would take only 265*4=1060 bits, but this requires recalculating the index portion when the CAM 2805 data is restored. This is easy at a rate of 1 or 2 entries per cycle, but may be difficult for 8 entries per cycle which would be needed for peak performance.

An intermediate approach implemented in one embodiment of the invention is to write out for each entry the length (4-bits) and only the low 4-bits of the index, consuming 8-bits per entry, which is the same size as the LUT. In this implementation, only the upper 5 bits of the index need to be generated, which can be done efficiently in parallel.

Some embodiments of the invention include a speculative decompression components which leverage the converging nature of Huffman codes to enable parallel, out-of-order symbol decoding. These embodiments break the serial dependency of Huffman codes and enable parallel out-of-order Deflate decompression using index based speculation.

Figure 30:
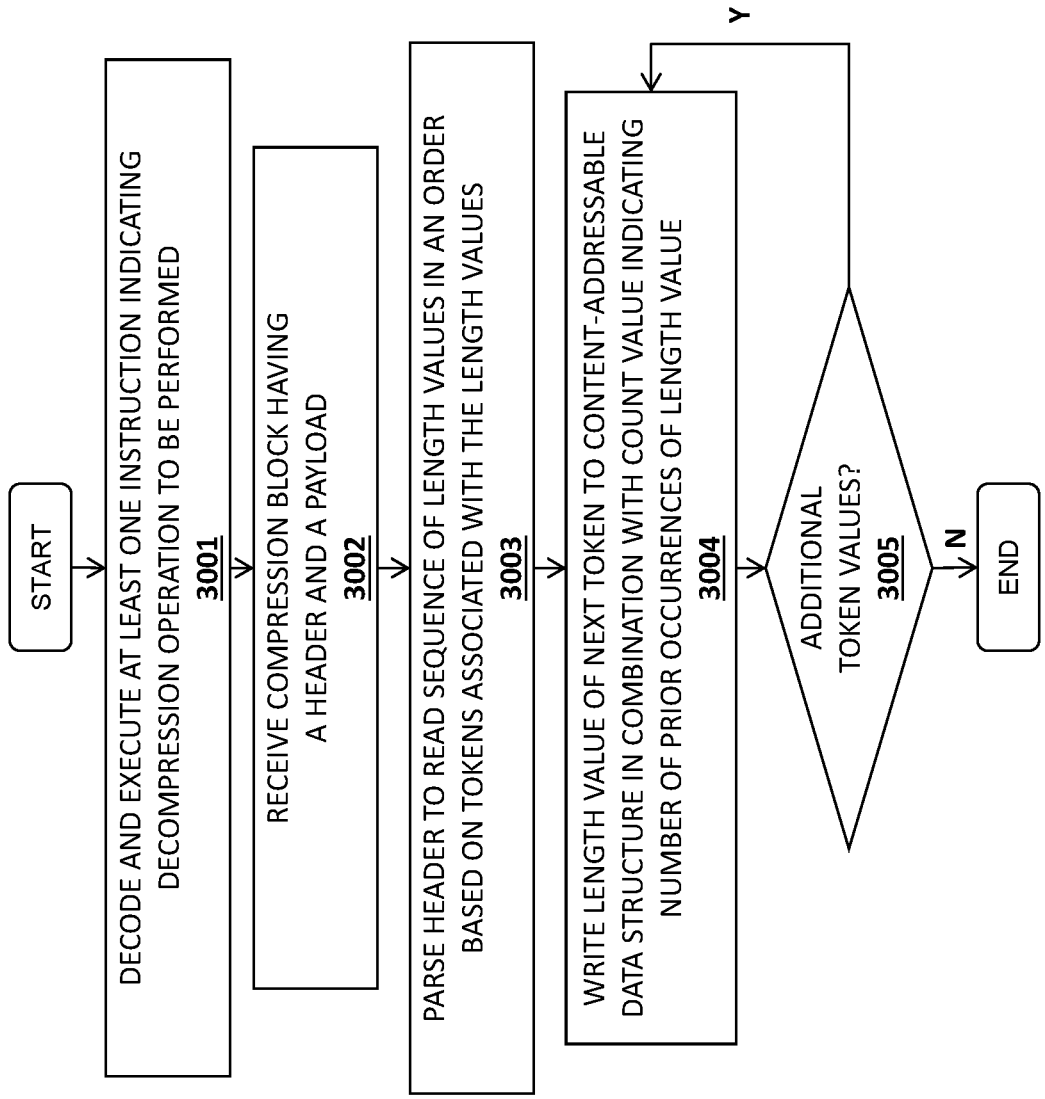
FIG. 30 illustrates a method in accordance with one embodiment of the invention.

A method in accordance with one embodiment of the invention is illustrated in FIG. 30. The method may be implemented on the processor and system architectures described herein, but is not limited to any particular architecture.

At 3001, at least one instruction is decoded and executed indicating a decompression operation to be performed. For example, one or more instructions may be executed to perform a Deflate decompression operation.

At 3002, a compression block is received (e.g., read from a memory location) which includes a header and a payload. In the case of a Deflate compression block, the header includes information required to reconstruct the Huffman table mapping between Huffman codes and tokens/symbols.

At 3003, the header is parsed to read a sequence of length values in an order based on the tokens/symbols associated with the length values. In FIGS. 29A-B, for example, the token values 1-10 are read in sequence from the header.

At 3004, the length value of the next token is written into the next entry of a content-addressable data structure, such as a content-addressable memory (CAM), in combination with a count value indicating the number of prior occurrences of the length value in the sequence of tokens. If additional token values need to be processed, determined at 3005, then the operation returns to 3004 for the next token. If not, then the process ends.

Figure 31:
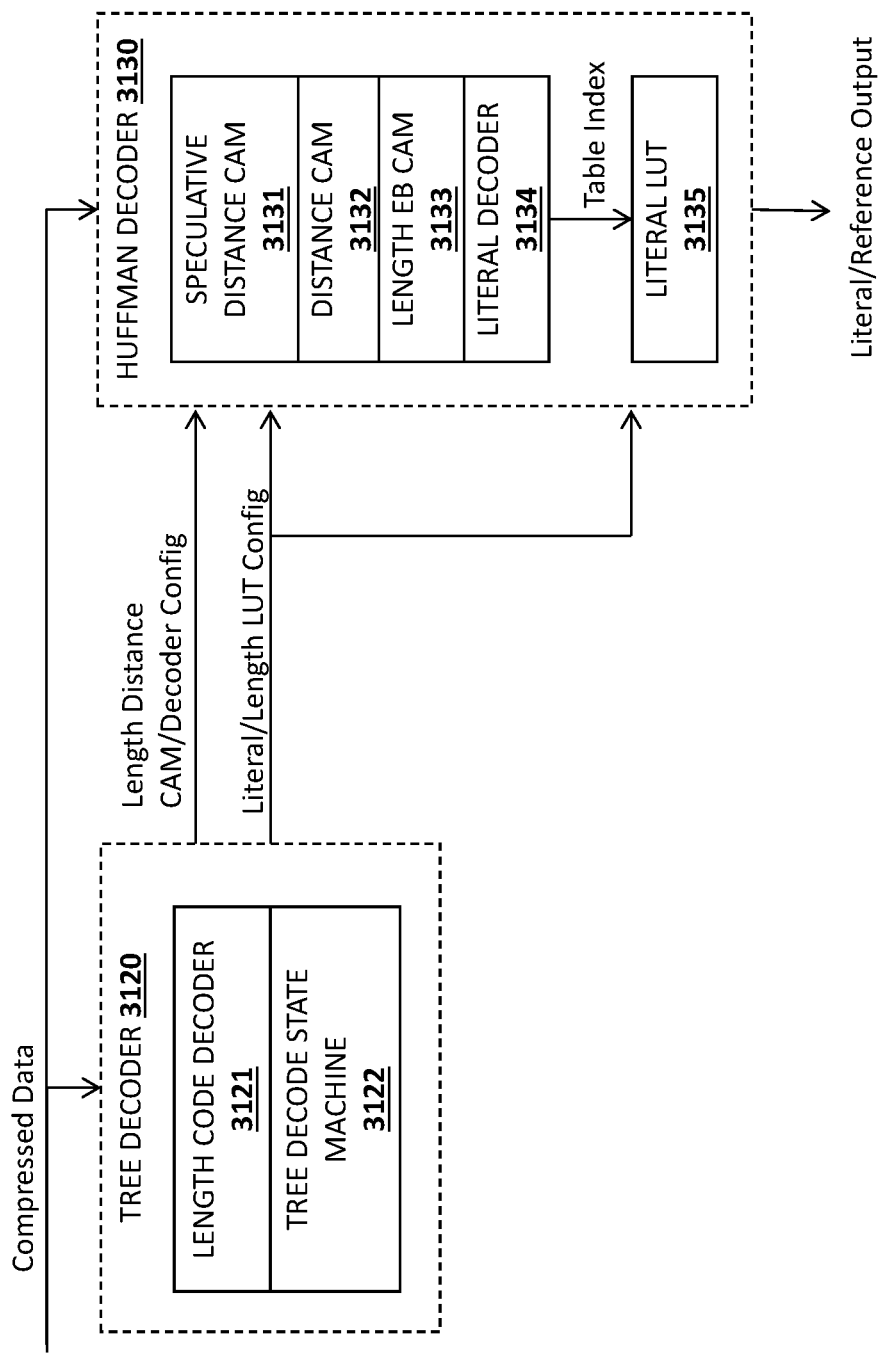
FIG. 31 illustrates one embodiment which generates a lookup table using literals/code lengths.

FIG. 31 illustrates an example implementation in which compressed Huffman tree data is decompressed by a tree decoder 3120 and the underlying compressed data is decompressed by a Huffman decoder 3130 using the decompressed tree data. In one embodiment, the tree decoder 3120 includes a length code decoder 3121 for decoding length code tokens and a tree decode state machine 3122 for continually updating and maintaining the current tree decoder state. As previously mentioned, the length code decoder 3121 may include a plurality of ALUs, although the underlying principles of the invention are not limited to an ALU-based implementation.

One implementation of the length code decoder 3121 takes one clock cycle to decode each length code token, which is used to configure the Huffman decoder 3130 as described herein. In particular, the tree decoder 3120 specifies configuration settings for the Huffman decoder 3130 including length/distance CAM/decoder configurations and the literal/length lookup table 3135 configuration.

In this embodiment, the Huffman decoder 3130 includes a speculative distance CAM 3131 to enable speculative decompression operations from within the compressed payload and a distance CAM 3132 to enable decoding from the beginning of the payload. For example, the distance CAM 3132 stores distances related to repeated values in the compressed data stream and one or more literal decoders 3134 determine the literal values which are used to perform lookups in the literal lookup table 3135 and generate the literal/reference output. In one implementation, the literal decoder 3134 (and literal lookup table 3135) is implemented with a plurality of ALUs to decode literals and lengths. In one embodiment, these codes form one alphabet, where symbols 0 . . . 255 are literals, 256 is EOB, and 257 and beyond are lengths. The length codes that use extra bits (EB) also hit in the EB CAM 3133, in which case the EB CAM 3133 is used to determine the starting offset of the next symbol rather than which ALU hit. But the lengths are still decoded in the literal decoder 3134 and looked up in the literal lookup table 3135 (along with the literals).

Figure 32:
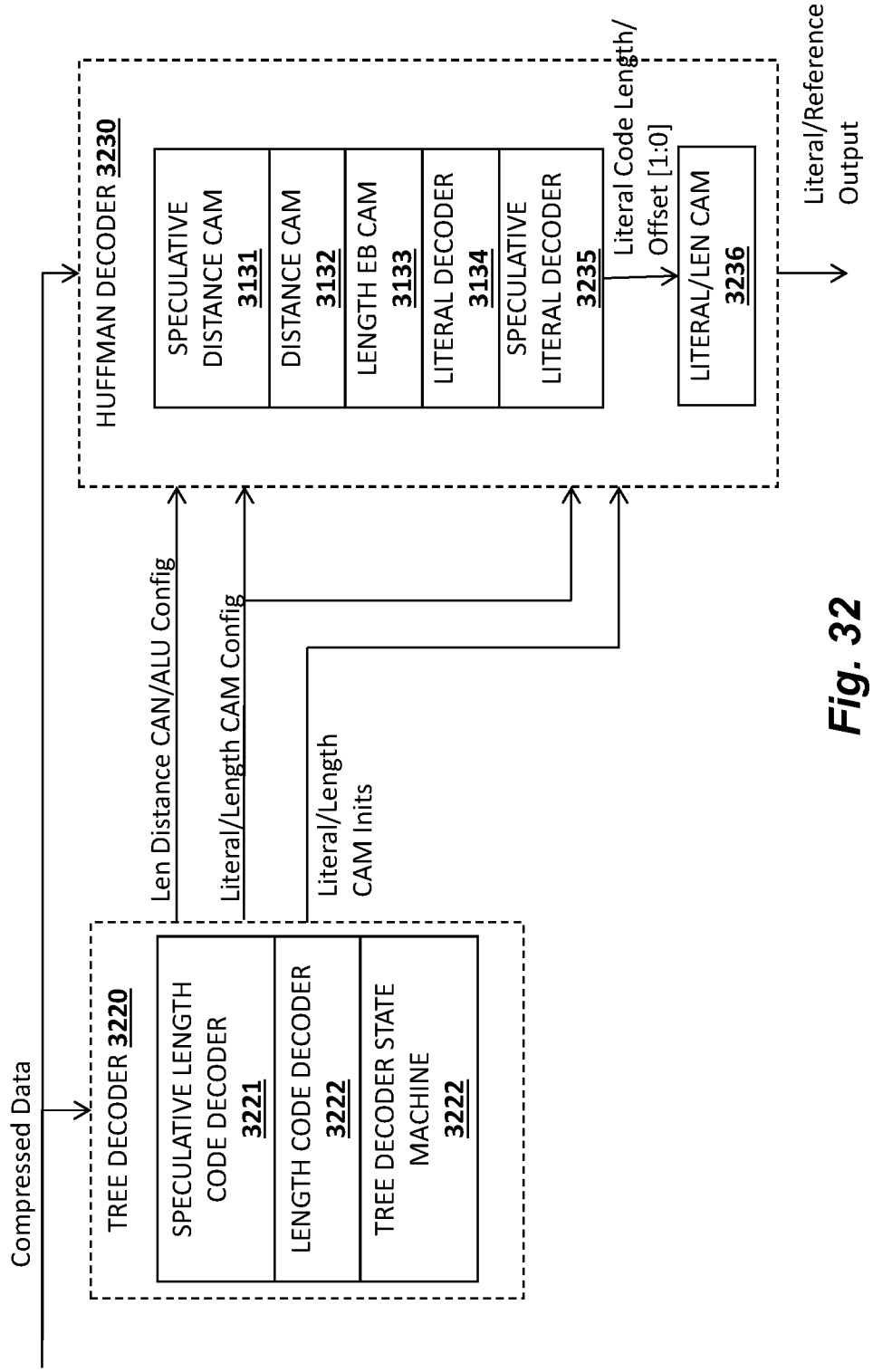
FIG. 32 illustrates an embodiment which generates a content addressable data structure using code lengths.

Referring now to FIG. 32, one embodiment of the tree decoder 3220 includes one or more speculative length code decoders 3221 to perform speculative length code operations in parallel with a non-speculative length code decoder 3222. As in other embodiments, a tree decoder state machine 3222 maintains the state of the tree decoder 3220.

Both the speculative length code decoder 3221 and the non-speculative length code decoder 3222 may include a plurality of sets of ALUs, although other implementations may be used consistent with the underlying principles of the invention. In one embodiment, the speculative length code decoder 3221 comprises a first plurality of sets of ALUs that are offset from the current bit position that is being decoded by the ALUs of the primary length code decoder 3222 by a value of min_length, min_length+1, min_length+2, and min_length+3 bits, where min_length is the minimum length-code length. The non-speculative length code decoder 3222 comprises a second plurality of sets of ALUs which are not offset from the current bit position. In one specific implementation, four sets of speculative length code ALUs 3221 are combined with a set of fifteen non-speculative length code ALUs 3222, although the underlying principles of the invention are not limited to these specific numbers.

The speculative length code ALUs 3221 used in combination with the non-speculative length code ALUs 3222 allow up to two code length codes to be decoded per cycle. In particular, two code length codes are decoded per cycle if the primary length code ALUs 3222 decodes a token that is within the range of min_length to min_length+3 bits. When this condition is met, up to two locations of the new literal/len CAM 3236 can be written per clock cycle.

In existing implementations, the tree decoder 3220 takes one clock to write the length for a symbol of the literal/length and distance alphabets when a "repeat code length of 0" is decoded. Consequently, for a maximum repeat value of N, this would consume N clock cycles (e.g., where N=138 in one particular implementation).

In contrast, in the embodiment in FIG. 32, the tree decoder 3220 does not need to write the code lengths of 0. Rather, as described above, the literal/len CAM 3236 initializes all locations with a code length of 0 at the beginning of each tree being decoded. When a "repeat code length of 0" is encountered, the tree decoder 3220 simply adds the repeat count value to the current symbol offset since it is no longer necessary to write the 0 code lengths. Given that the maximum repeat count can be significant (e.g., 138) this can save numerous cycles each time a repeat code length of 0 is decoded.

One embodiment also improves performance for decoding "copy previous code length" tokens. Existing implementations consume one clock cycle to write the length for every symbol updated using the "copy previous code length" token in accordance with a maximum repeat length value for the token (e.g., 6 in one specific implementation). In contrast, because the embodiment described above provides for two symbol length updates per cycle, this cuts the maximum processing time in half (e.g., from 6 cycles to 3 cycles for this type of token).

One embodiment of the invention skips the code generation for literals and length codes that don't require extra bits (e.g., codes 257-264 of the literal/length alphabet). In particular, because the literal/length CAM 3236 as implemented herein eliminates the need for the tree decoder 3220 to create a table index, a table index for each of the 256 literals and for length codes not requiring extra bits is not required. Instead, in accordance with the embodiments described herein, the literal/length CAM 3236 is programmed when the length code tokens are decoded, allowing the tree decoder 3220 to skip the entire table index generation process and save a significant number of clock cycles (e.g., 264).

In one embodiment, the speculative/non-speculative length code decoders 3221-3222 are configurable to determine distance and length codes requiring extra bits (e.g., codes 265-285) in parallel, in contrast to implementations which consume one clock cycle to compute each code. The tree decoder 3220 of this embodiment computes up to a specified number of these codes per cycle (e.g., 6), significantly improving the performance of loading the distance/length extra bits (EB) CAMs 3133.

As mentioned, in the embodiment shown in FIG. 32, the Huffman decoder 3230 performs symbol decode operations using a speculative literal decoder 3235. In one implementation, the speculative literal decoder 3235 decodes a second literal when the primary literal decoder 3234 decodes a literal. One embodiment of the speculative literal decoder 3235 includes a plurality of sets of ALUs (e.g., 6 sets) that are offset from the current bit position that is being decoded by the primary literal decoder 3234 by a value of min_literal_length, up to min_literal_length+5 bits, where min_literal_length is the minimum length of a literal code. This allows up to two literals to be decoded per cycle, as indicated by the literal code length/offset [0:1] signal applied to the literal/length CAM 3236.

The embodiments described above allow for a significant reduction in time spent parsing the Deflate header. For applications such as tiered-memory compression, where the data sizes tend to be small (e.g. 4 kB), and where decompress latency is the primary optimization point, this reduction of header parsing latency directly translates to a reduced decompression latency, which is critical.

In the foregoing specification, the embodiments of invention have been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

Embodiments of the invention may include various steps, which have been described above. The steps may be embodied in machine-executable instructions which may be used to cause a general-purpose or special-purpose processor to perform the steps. Alternatively, these steps may be performed by specific hardware components that contain hardwired logic for performing the steps, or by any combination of programmed computer components and custom hardware components.

EXAMPLES

The following are example implementations of different embodiments of the invention.

Example 1. An apparatus comprising: a decoder to decode one or more instructions; execution circuitry to execute the one or more instructions, the execution circuitry including decompression acceleration circuitry to: extract a sequence of tokens and corresponding length values from a header of a compression block, the tokens and corresponding length values associated with a type of compression used to compress a payload of the compression block; and construct a content-addressable data structure based on the tokens and length values, the content-addressable data structure builder to write an entry in the content-addressable data structure comprising a length value and a count value, the count value indicating a number of times the length value was previously written to an entry in the content-addressable data structure.

Example 2. The apparatus of example 1 wherein the decompression acceleration circuitry includes a content-addressable data structure builder to write the rows of the content-addressable data structure in a sequence corresponding to the sequence of tokens and corresponding length values extracted from the header of the compression block.

Example 3. The apparatus of example 2 further comprising: a plurality of counters to maintain current counts of the number of times corresponding length values were previously written to rows in the content-addressable data structure, the content-addressable data structure builder to write a count value from a first counter to a current row of the content-addressable data structure when a length value corresponding to the first counter is to be written to the row.

Example 4. The apparatus of example 3 wherein the content-addressable data structure builder is to increment the count value in the first counter.

Example 5. The apparatus of example 1 wherein the content-addressable data structure comprises a content-addressable memory (CAM).

Example 6. The apparatus of example 1 wherein the decompression acceleration circuitry further comprises: decompression circuitry to decode the payload of the compression block using the content-addressable data structure.

Example 7. The apparatus of example 6 wherein the type of compression comprises Deflate compression and wherein the decompression circuitry comprises a Huffman decoder.

Example 8. The apparatus of example 7 wherein the Huffman decoder comprises: a first decompression module to perform a non-speculative decompression of a first portion of the payload comprising a first plurality of tokens; and a second decompression module to perform speculative decompression of a second portion of the payload comprising a second plurality of tokens concurrently with the non-speculative decompression performed by the first compression module.

Example 9. The apparatus of example 1 wherein each count value written to an entry of the content-addressable data structure is to be used as a portion of an index value to identify the corresponding row when performing a lookup into the content-addressable data structure.

Example 10. The apparatus of example 6 wherein the decompression circuitry comprises a plurality of arithmetic logic units (ALUs) to construct an index into the content-addressable data structure based on an ALU size corresponding to a length value in a corresponding row to be indexed.

Example 11. The apparatus of example 1 further comprising: a decompression state manager to store the content-addressable data structure using a variable number of bits for at least some entries in the content-addressable data structure based on a number of non-trivial bits required to store a count value associated with the entries.

Example 12. The apparatus of example 2 further comprising: a speculative header parser to extract a second sequence of tokens and corresponding length values from the header; and a speculative content-addressable data structure builder to construct speculative entries in the content-addressable data structure based on the second sequence of tokens and length values, the speculative content-addressable data structure builder to write a speculative entry in the content-addressable data structure comprising a second length value and a second count value, the second count value indicating a number of times the second length value was previously written to the content-addressable data structure.

Example 13. A method comprising: extracting a sequence of tokens and corresponding length values from a header of a compression block, the tokens and corresponding length values associated with a type of compression used to compress a payload of the compression block; and constructing a content-addressable data structure based on the tokens and length values by: writing to an entry in the content-addressable data structure including writing a length value and a count value, the count value indicating a number of times the length value was previously written to an entry in the content-addressable data structure.

Example 14. The method of example 13 wherein the rows of the content-addressable data structure are to be written in a sequence corresponding to the sequence of tokens and corresponding length values extracted from the header of the compression block.

Example 15. The method of example 13 further comprising: counting the number of times corresponding length values were previously written to rows in the content-addressable data structure; and writing a count value from a first counter to a current row of the content-addressable data structure when a length value corresponding to the first counter is to be written to the row.

Example 16. The method of example 15 further comprising: incrementing the count value in the first counter.

Example 17. The method of example 13 wherein the content-addressable data structure comprises a content-addressable memory (CAM).

Example 18. The method of example 13 further comprising: decoding the payload of the compression block using the content-addressable data structure.

Example 19. The method of example 18 wherein the type of compression comprises Deflate compression and wherein decoding is performed by a Huffman decoder.

Example 20. The method of example 19 further comprising: performing non-speculative decompression of a first portion of the payload comprising a first plurality of tokens; and performing speculative decompression of a second portion of the payload comprising a second plurality of tokens concurrently with the non-speculative decompression.

Example 21. The method of example 13 wherein each count value written to an entry of the content-addressable data structure is to be used as a portion of an index value to identify the corresponding row when performing a lookup into the content-addressable data structure.

Example 22. The method of example 18 wherein decoding the payload is performed by a plurality of arithmetic logic units (ALUs), an index into the content-addressable data structure to be constructed using an ALU size corresponding to a length value in a corresponding row to be indexed.

Example 23. The method of example 13 further comprising: storing the content-addressable data structure using a variable number of bits for at least some entries in the content-addressable data structure based on a number of non-trivial bits required to store a count value associated with the entries.

Example 24. The method of example 13 further comprising: speculatively extracting a second sequence of tokens and corresponding length values from the header; and constructing speculative entries in the content-addressable data structure based on the second sequence of tokens and length values including writing a speculative entry in the content-addressable data structure comprising a second length value and a second count value, the second count value indicating a number of times the second length value was previously written to the content-addressable data structure.

Example 25. A machine-readable medium having program code stored thereon which, when executed by a machine, causes the machine to perform the operations of: extracting a sequence of tokens and corresponding length values from a header of a compression block, the tokens and corresponding length values associated with a type of compression used to compress a payload of the compression block; and constructing a content-addressable data structure based on the tokens and length values by: writing to an entry in the content-addressable data structure including writing a length value and a count value, the count value indicating a number of times the length value was previously written to an entry in the content-addressable data structure.

Example 26. The method of example 25 wherein the rows of the content-addressable data structure are to be written in a sequence corresponding to the sequence of tokens and corresponding length values extracted from the header of the compression block.

Example 27. The method of example 25 further comprising: counting the number of times corresponding length values were previously written to rows in the content-addressable data structure; and writing a count value from a first counter to a current row of the content-addressable data structure when a length value corresponding to the first counter is to be written to the row.

Example 28. The method of example 27 further comprising: incrementing the count value in the first counter.

Example 29. The method of example 25 wherein the content-addressable data structure comprises a content-addressable memory (CAM).

Example 30. The method of example 25 further comprising: decoding the payload of the compression block using the content-addressable data structure.

Example 31. The method of example 30 wherein the type of compression comprises Deflate compression and wherein decoding is performed by a Huffman decoder.

Example 32. The method of example 30 further comprising: performing non-speculative decompression of a first portion of the payload comprising a first plurality of tokens; and performing speculative decompression of a second portion of the payload comprising a second plurality of tokens concurrently with the non-speculative decompression.

Example 33. The method of example 25 wherein each count value written to an entry of the content-addressable data structure is to be used as a portion of an index value to identify the corresponding row when performing a lookup into the content-addressable data structure.

Example 34. The method of example 30 wherein decoding the payload is performed by a plurality of arithmetic logic units (ALUs), an index into the content-addressable data structure to be constructed using an ALU size corresponding to a length value in a corresponding row to be indexed.

Example 35. The method of example 25 further comprising: storing the content-addressable data structure using a variable number of bits for at least some entries in the content-addressable data structure based on a number of non-trivial bits required to store a count value associated with the entries.

Example 36. The method of example 25 further comprising: speculatively extracting a second sequence of tokens and corresponding length values from the header; and constructing speculative entries in the content-addressable data structure based on the second sequence of tokens and length values including writing a speculative entry in the content-addressable data structure comprising a second length value and a second count value, the second count value indicating a number of times the second length value was previously written to the content-addressable data structure.

As described herein, instructions may refer to specific configurations of hardware such as application specific integrated circuits (ASICs) configured to perform certain operations or having a predetermined functionality or software instructions stored in memory embodied in a non-transitory computer readable medium. Thus, the techniques shown in the Figures can be implemented using code and data stored and executed on one or more electronic devices (e.g., an end station, a network element, etc.). Such electronic devices store and communicate (internally and/or with other electronic devices over a network) code and data using computer machine-readable media, such as non-transitory computer machine-readable storage media (e.g., magnetic disks; optical disks; random access memory; read only memory; flash memory devices; phase-change memory) and transitory computer machine-readable communication media (e.g., electrical, optical, acoustical or other form of propagated signals—such as carrier waves, infrared signals, digital signals, etc.). In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). The storage device and signals carrying the network traffic respectively represent one or more machine-readable storage media and machine-readable communication media. Thus, the storage device of a given electronic device typically stores code and/or data for execution on the set of one or more processors of that electronic device. Of course, one or more parts of an embodiment of the invention may be implemented using different combinations of software, firmware, and/or hardware. Throughout this detailed description, for the purposes of explanation, numerous specific details were set forth in order to provide a thorough understanding of the present invention. It will be apparent, however, to one skilled in the art that the invention may be practiced without some of these specific details. In certain instances, well known structures and functions were not described in elaborate detail in order to avoid obscuring the subject matter of the present invention. Accordingly, the scope and spirit of the invention should be judged in terms of the claims which follow.

What is claimed is:

1. An apparatus comprising:
   a decoder to decode one or more instructions;
   execution circuitry to execute the one or more instructions, the execution circuitry including decompression acceleration circuitry to:
   extract a sequence of tokens and corresponding length values from a header of a compression block, the tokens and corresponding length values associated with a type of compression used to compress a payload of the compression block; and
   construct a content-addressable data structure based on the tokens and length values, the content-addressable data structure builder to write an entry in the content-addressable data structure comprising a length value and a count value, the count value indicating a number of times the length value was previously written to an entry in the content-addressable data structure.

2. The apparatus of claim 1 wherein the decompression acceleration circuitry includes a content-addressable data structure builder to write the rows of the content-addressable data structure in a sequence corresponding to the sequence of tokens and corresponding length values extracted from the header of the compression block.

3. The apparatus of claim 2 further comprising:
   a plurality of counters to maintain current counts of the number of times corresponding length values were previously written to rows in the content-addressable data structure, the content-addressable data structure builder to write a count value from a first counter to a current row of the content-addressable data structure when a length value corresponding to the first counter is to be written to the row.

4. The apparatus of claim 3 wherein the content-addressable data structure builder is to increment the count value in the first counter.

5. The apparatus of claim 2 further comprising:
a speculative header parser to extract a second sequence of tokens and corresponding length values from the header; and
a speculative content-addressable data structure builder to construct speculative entries in the content-addressable data structure based on the second sequence of tokens and length values, the speculative content-addressable data structure builder to write a speculative entry in the content-addressable data structure comprising a second length value and a second count value, the second count value indicating a number of times the second length value was previously written to the content-addressable data structure.

6. The apparatus of claim 1 wherein the content-addressable data structure comprises a content-addressable memory (CAM).

7. The apparatus of claim 1 wherein the decompression acceleration circuitry further comprises:
decompression circuitry to decode the payload of the compression block using the content-addressable data structure.

8. The apparatus of claim 7 wherein the type of compression comprises Deflate compression and wherein the decompression circuitry comprises a Huffman decoder.

9. The apparatus of claim 8 wherein the Huffman decoder comprises:
a first decompression module to perform a non-speculative decompression of a first portion of the payload comprising a first plurality of tokens; and
a second decompression module to perform speculative decompression of a second portion of the payload comprising a second plurality of tokens concurrently with the non-speculative decompression performed by the first compression module.

10. The apparatus of claim 7 wherein the decompression circuitry comprises a plurality of arithmetic logic units (ALUs) to construct an index into the content-addressable data structure based on an ALU size corresponding to a length value in a corresponding row to be indexed.

11. The apparatus of claim 1 wherein each count value written to an entry of the content-addressable data structure is to be used as a portion of an index value to identify the corresponding row when performing a lookup into the content-addressable data structure.

12. The apparatus of claim 1 further comprising:
a decompression state manager to store the content-addressable data structure using a variable number of bits for at least some entries in the content-addressable data structure based on a number of non-trivial bits required to store a count value associated with the entries.

13. A method comprising:
extracting a sequence of tokens and corresponding length values from a header of a compression block, the tokens and corresponding length values associated with a type of compression used to compress a payload of the compression block; and
constructing a content-addressable data structure based on the tokens and length values by:
writing to an entry in the content-addressable data structure including writing a length value and a count value, the count value indicating a number of times the length value was previously written to an entry in the content-addressable data structure.

14. The method of claim 13 wherein the rows of the content-addressable data structure are to be written in a sequence corresponding to the sequence of tokens and corresponding length values extracted from the header of the compression block.

15. The method of claim 13 further comprising:
counting the number of times corresponding length values were previously written to rows in the content-addressable data structure; and
writing a count value from a first counter to a current row of the content-addressable data structure when a length value corresponding to the first counter is to be written to the row.

16. The method of claim 15 further comprising:
incrementing the count value in the first counter.

17. The method of claim 13 wherein the content-addressable data structure comprises a content-addressable memory (CAM).

18. The method of claim 13 further comprising:
decoding the payload of the compression block using the content-addressable data structure.

19. The method of claim 18 wherein the type of compression comprises Deflate compression and wherein decoding is performed by a Huffman decoder.

20. The method of claim 19 further comprising:
performing non-speculative decompression of a first portion of the payload comprising a first plurality of tokens; and
performing speculative decompression of a second portion of the payload comprising a second plurality of tokens concurrently with the non-speculative decompression.

21. The method of claim 18 wherein decoding the payload is performed by a plurality of arithmetic logic units (ALUs), an index into the content-addressable data structure to be constructed using an ALU size corresponding to a length value in a corresponding row to be indexed.

22. The method of claim 13 wherein each count value written to an entry of the content-addressable data structure is to be used as a portion of an index value to identify the corresponding row when performing a lookup into the content-addressable data structure.

23. The method of claim 13 further comprising:
storing the content-addressable data structure using a variable number of bits for at least some entries in the content-addressable data structure based on a number of non-trivial bits required to store a count value associated with the entries.

24. The method of claim 13 further comprising:
speculatively extracting a second sequence of tokens and corresponding length values from the header; and
constructing speculative entries in the content-addressable data structure based on the second sequence of tokens and length values including writing a speculative entry in the content-addressable data structure comprising a second length value and a second count value, the second count value indicating a number of times the second length value was previously written to the content-addressable data structure.

25. A machine-readable medium having program code stored thereon which, when executed by a machine, causes the machine to perform the operations of:
extracting a sequence of tokens and corresponding length values from a header of a compression block, the tokens and corresponding length values associated with a type of compression used to compress a payload of the compression block; and
constructing a content-addressable data structure based on the tokens and length values by:

writing to an entry in the content-addressable data structure including writing a length value and a count value, the count value indicating a number of times the length value was previously written to an entry in the content-addressable data structure.

26. The machine-readable medium of claim 25 wherein the rows of the content-addressable data structure are to be written in a sequence corresponding to the sequence of tokens and corresponding length values extracted from the header of the compression block.

27. The machine-readable medium of claim 25 further comprising:
counting the number of times corresponding length values were previously written to rows in the content-addressable data structure; and
writing a count value from a first counter to a current row of the content-addressable data structure when a length value corresponding to the first counter is to be written to the row.

28. The machine-readable medium of claim 27 further comprising:
incrementing the count value in the first counter.

29. The machine-readable medium of claim 25 wherein the content-addressable data structure comprises a content-addressable memory (CAM).

30. The machine-readable medium of claim 25 further comprising:
decoding the payload of the compression block using the content- addressable data structure.

31. The machine-readable medium of claim 30 wherein the type of compression comprises Deflate compression and wherein decoding is performed by a Huffman decoder.

32. The machine-readable medium of claim 30 further comprising:
performing non-speculative decompression of a first portion of the payload comprising a first plurality of tokens; and
performing speculative decompression of a second portion of the payload comprising a second plurality of tokens concurrently with the non- speculative decompression.

33. The method of claim 25 wherein each count value written to an entry of the content-addressable data structure is to be used as a portion of an index value to identify the corresponding row when performing a lookup into the content-addressable data structure.

34. The method of claim 30 wherein decoding the payload is performed by a plurality of arithmetic logic units (ALUs), an index into the content-addressable data structure to be constructed using an ALU size corresponding to a length value in a corresponding row to be indexed.

35. The method of claim 25 further comprising:
storing the content-addressable data structure using a variable number of bits for at least some entries in the content-addressable data structure based on a number of non-trivial bits required to store a count value associated with the entries.

36. The method of claim 25 further comprising:
speculatively extracting a second sequence of tokens and corresponding length values from the header; and
constructing speculative entries in the content-addressable data structure based on the second sequence of tokens and length values including writing a speculative entry in the content-addressable data structure comprising a second length value and a second count value, the second count value indicating a number of times the second length value was previously written to the content-addressable data structure.

* * * * *